(12) United States Patent
Okamura et al.

(10) Patent No.: US 10,604,173 B2
(45) Date of Patent: Mar. 31, 2020

(54) LOAD DRIVE DEVICE

(71) Applicants: Akio Okamura, Aichi (JP); Shinichi Togawa, Aichi (JP)

(72) Inventors: Akio Okamura, Aichi (JP); Shinichi Togawa, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 16/171,880

(22) Filed: Oct. 26, 2018

(65) Prior Publication Data

US 2019/0126972 A1 May 2, 2019

(30) Foreign Application Priority Data

Oct. 27, 2017 (JP) .................. 2017-207793

(51) Int. Cl.
| | |
|---|---|
| *H02P 7/00* | (2016.01) |
| *B62D 5/04* | (2006.01) |
| *H02K 11/33* | (2016.01) |
| *H02P 6/16* | (2016.01) |
| *H05K 1/02* | (2006.01) |
| *H05K 1/18* | (2006.01) |

(Continued)

(52) U.S. Cl.
CPC .......... *B62D 5/0406* (2013.01); *H02K 11/33* (2016.01); *H02P 6/16* (2013.01); *H05K 1/0206* (2013.01); *H05K 1/181* (2013.01); *H05K 5/0047* (2013.01); *H05K 5/0069* (2013.01); *H02K 2211/03* (2013.01); *H02P 27/06* (2013.01)

(58) Field of Classification Search
CPC .... B62D 5/0406; H02K 11/33; H05K 5/0069; H05K 1/181; H05K 1/0206; H05K 5/0047; H02P 6/16
USPC ........................................................ 318/558
See application file for complete search history.

(56) References Cited

U.S. PATENT DOCUMENTS

| | | | |
|---|---|---|---|
| 2006/0180647 A1* | 8/2006 | Hansen ..................... B60S 3/00 | |
| | | | 235/375 |
| 2012/0262093 A1* | 10/2012 | Recker ............... H05B 33/0854 | |
| | | | 315/308 |
| 2016/0036303 A1 | 2/2016 | Kadoike et al. | |

(Continued)

FOREIGN PATENT DOCUMENTS

| | | |
|---|---|---|
| JP | 2015-60756 A | 3/2015 |
| JP | 2016-34202 A | 3/2016 |

*Primary Examiner* — Eduardo Colon Santana
*Assistant Examiner* — Gabriel Agared
(74) *Attorney, Agent, or Firm* — Osha Liang LLP

(57) ABSTRACT

A board of a controller of a load drive device includes: wiring layers provided on front and rear surfaces and inside thereof and ground layers provided inside thereof. Each wiring layer is divided into: a first region in which a drive circuit is provided; and a second region in which a control circuit is provided. A first ground layer including a first ground pattern for a circuit which is electrically connected to a wiring pattern of each wiring layer is divided into: a third region which overlaps with the first region in a thickness direction, and in which the first ground pattern for a power system electrically connected to the drive circuit is provided, and a fourth region which overlaps with the second region in the thickness direction, and in which the first ground pattern for a control system electrically connected to the control circuit is provided.

7 Claims, 11 Drawing Sheets

(51) Int. Cl.
*H05K 5/00* (2006.01)
*H02P 27/06* (2006.01)

(56) References Cited

U.S. PATENT DOCUMENTS

| | | | |
|---|---|---|---|
| 2016/0244088 A1 | 8/2016 | Hagiwara | |
| 2017/0331177 A1* | 11/2017 | MacCallum | B64B 1/48 |
| 2018/0048149 A1* | 2/2018 | Testani | G05F 1/00 |
| 2018/0058463 A1* | 3/2018 | Rollins | F04D 25/0606 |

* cited by examiner

LOAD DRIVE DEVICE

CROSS-REFERENCES TO RELATED APPLICATIONS

This application is based upon and claims the benefit of priority from Japanese Patent Application No. 2017-207793, filed on Oct. 27, 2017, the entire contents of which are incorporated herein by reference.

FIELD

One or more embodiments of the present invention relate to a structure of a load drive device in which an electric motor and a controller are integrated with each other.

BACKGROUND

For example, as disclosed in JP-A-2015-60756 and JP-A-2016-34202, an electric power steering system mounted on a vehicle such as an automobile includes a load drive device in which an electric motor for assisting a steering operation of a steering wheel and a controller for controlling the electric motor are integrated with each other. The electric motor-integrated load drive device includes a board on which an electric circuit for driving and controlling the electric motor and an electronic component are mounted, an input/output connector through which an external device inputs or outputs power or a signal to or from the board, and a housing which accommodates the electric motor and the board.

The electric motor includes a coil, a motor terminal for supplying a current to the coil, and a rotor rotated by supplying the current to the coil. According to the load drive device disclosed in JP-A-2015-60756 and JP-A-2016-34202, the electric motor is incorporated in the housing so that the motor terminal and a shaft of the rotor protrude in an axial direction of a rotation axis of the electric motor. A frame (case) is connected to the housing, and the board is fixed to the frame. A cover is attached to the frame so as to cover the board.

According to JP-A-2015-60756, the load drive device includes a first board having a drive circuit mounted for driving the electric motor by supplying the current to the coil and a second board having a control circuit mounted for controlling driving of the electric motor. The first board and the second board are electrically connected to each other by an external connection terminal such as a bus bar. One end portion of the motor terminal of the electric motor is connected to the coil, and the other end portion of the motor terminal is electrically connected to the board by penetrating the frame.

Incidentally, various electronic devices are mounted on the vehicle in addition to a driving system such as an engine. In order to achieve weight reduction and miniaturization of the vehicle, the respective electronic devices also need miniaturization. The electric motor and the controller are integrated with each other in the electric power steering system. Accordingly, an occupied space of the electric power steering system inside the vehicle is reduced to a certain extent. However, even in a case where the integrated device is mounted on the vehicle, the vehicle needs further miniaturization. The controller includes a heat-generating electronic component having a high calorific value, such as a semiconductor switching element. Heat generated by the heat-generating electronic component causes a possibility that a malfunction or a failure may occur in the controller. Therefore, a countermeasure has been needed to radiate the heat generated by the heat-generating electronic component.

Therefore, according to JP-A-2015-60756 and JP-A-2016-34202, the frame (case) is connected to the housing on one side in the axial direction of the electric motor, and the board is fixed to the metal frame and the cover so that the board is perpendicular to the axial direction of the electric motor. The board is formed so as to have a size approximately the same as a diameter of the electric motor. In this manner, the electronic component configuring the electric circuit for driving and controlling the electric motor is mounted on a region where the board and the electric motor overlap with each other in the axial direction. The input/output connector whose outer shape is larger than that of other electronic components is mounted at a position where the board and the electric motor do not overlap with each other in the axial direction. According to JP-A-2016-34202, only one board is provided, and a drive circuit and a control circuit for the electric motor are mounted on the board. Furthermore, a heat conduction rate is improved as follows. The frame is used to serve as a heat sink, and an insulating heat radiation material is disposed between the electronic component mounted on a rear surface of the board and the frame.

SUMMARY

According to the load drive device as described above, in a case where the drive circuit for driving the electric motor and the control circuit for controlling the driving of the electric motor are disposed on one board, there is a possibility that the device may malfunction due to noise of a signal generated in the drive circuit or the control circuit.

Multiple electronic devices are mounted on the vehicle. Accordingly, electromagnetic waves are generated from the electric circuit included in each of the electronic device, thereby causing a possibility that the electromagnetic waves may generate electromagnetic wave noise which adversely affects other electronic devices to suffer the malfunction and the failure. Therefore, the load drive device needs to have resistance to the electromagnetic wave noise generated from the electric circuit incorporated therein or the electromagnetic wave noise generated by other external devices.

An object of one or more embodiments of the invention is to realize miniaturization, to prevent a device malfunction, and to improve heat radiating performance and resistance to electromagnetic wave noise in a load drive device in which an electric motor and a controller are integrated with each other.

According to one or more embodiments of the invention, there is provided a load drive device including: an electric motor that drives a load; a controller that includes a board provided with electronic components mounted thereon and configured to drive and control the electric motor; a housing in which the electric motor is incorporated; a frame that is connected to the housing and serves as a heat sink; and a cover that is attached to the frame so as to cover the board, wherein the board is fixed to the frame so as to be electrically connected to a motor terminal configured to supply a current to the electric motor and perpendicular to an axial direction of a rotation axis of the electric motor, wherein the board is one multilayer printed board including: wiring layers including wiring patterns and provided on a front surface and a rear surface of the multilayer printed board, respectively; at least one wiring layer including a wiring pattern and provided inside the multilayer printed board; and at least two ground layers including ground patterns, respectively, and provided inside the multilayer printed board, and the board includes an interlayer connection wire that electrically connects the patterns of the different layers, wherein the wiring pattern of each of the wiring layers configures a part of an electric circuit of the controller, wherein the electronic components included in the electric circuit are mounted on the front surface and the rear surface of the board, respectively, wherein the at least two ground layers include: a first ground layer including a first ground pattern for a circuit which is electrically connected to the wiring pattern of each of the wiring layers; and a second ground layer including a second ground pattern for electromagnetic wave noise resistance which is electrically connected to the frame, wherein the electric circuit of the controller includes: a drive circuit that drives the electric motor; and a control circuit that controls the electric motor, wherein each of the wiring layers is divided into: a first region in which the drive circuit is provided, and a second region in which the control circuit is provided, and wherein the first ground layer is divided into: a third region which overlaps with the first region in a thickness direction of the board, and in which the first ground pattern for a power system electrically connected to the drive circuit is provided, and a fourth region which overlaps with the second region in the thickness direction of the board, and in which the first ground pattern for a control system electrically connected to the control circuit is provided.

According to the above-described configuration, in the load drive device in which the controller and the electric motor are integrated with each other, the controller is configured to include one multilayer printed board having the electronic component mounted thereon so as to drive and control the electric motor. The board is accommodated in an internal space surrounded by the frame and the cover. Accordingly, the drive circuit and the control circuit of the electric motor do not need to be electrically connected to each other by using an external connection terminal such as a bus bar. The drive circuit and the control circuit of the electric motor may be electrically connected to each other by using the wiring pattern disposed in the board. Therefore, the load drive device can be miniaturized in the axial direction of the electric motor.

Three or more wiring layers are respectively disposed inside of the front surface and the rear surface of the board. The wiring patterns of the respective wiring layers are electrically connected to each other by using the interlayer connection wire. Accordingly, the electric circuit can be more freely designed by increasing current capacity of the wiring pattern for supplying the current to the electric motor. The respective wiring layers are divided into the first region having the drive circuit of the electric motor and the second region having the control circuit of the electric motor. The first ground layer disposed inside the board is divided into the third region overlapping with the first region in the thickness direction of the board and the fourth region overlapping with the second region in the thickness direction of the board. The first ground pattern for the power system electrically connected to the drive circuit is disposed in the third region. The first ground pattern for the control system electrically connected to the control circuit is disposed in the fourth region. Therefore, the controller can be prevented from malfunctioning due to signal noise generated in the drive circuit or the control circuit in the board.

The frame for fixing the board is used as the heat sink. Accordingly, the heat generated from the electronic component mounted on the board can be radiated outward by the frame. The board internally has the second ground layer having the second ground pattern for electromagnetic wave noise resistance which is electrically connected to the frame. Accordingly, the second ground pattern of the second ground layer is electrically insulated from the first ground pattern of the first ground layer or the wiring pattern of the wiring layer, and the frame is grounded to the ground. In this manner, as the electromagnetic wave noise, the electromagnetic waves generated from the electric circuit formed on the board can be restrained from adversely affecting an external electronic device. As the electromagnetic wave noise, the electromagnetic waves generated from the external electronic device can be restrained from adversely affecting the electric circuit formed in the board.

In one or more embodiments of the invention, a rotation sensor configured to detect a rotation state of the electric motor may be mounted at a position facing one end portion of the rotation axis on the rear surface of the board. In the board, the first region and the third region may be disposed on one side which does not include the rotation sensor with respect to a mounting position of the rotation sensor, and the second region and the fourth region may be disposed on the other side which includes the rotation sensor with respect to the mounting position of the rotation sensor.

In one or more embodiments of the invention, the motor terminal may penetrate a portion of the frame overlapping with the electric motor in the axial direction, the motor terminal may be electrically connected to a portion of the board overlapping with the electric motor in the axial direction, and the motor terminal may be electrically insulated from the frame. The motor terminal may include a connector mounted on a portion of the board which does not overlap with the electric motor in the axial direction. The connector may have a first fitting portion to which a first harness configured to supply the current from an external power source is fitted in an axial direction of the electric motor, and a second fitting portion to which a second harness configured to perform signal communication with an external device is fitted in the axial direction of the electric motor. The first fitting portion and the second fitting portion may be exposed to an electric motor side from the frame.

In one or more embodiments of the invention, the third region and the fourth region of the first ground layer may merge with each other in the vicinity of the connector.

In one or more embodiments of the invention, a plurality of semiconductor switching elements configured to switch the current to be supplied to the electric motor may be mounted on a portion of the first region overlapping with the electric motor in the axial direction. An electrolytic capacitor electrically connected to the plurality of semiconductor switching elements may be mounted in the vicinity of one of the semiconductor switching elements which is located at a position farthest away from the connector and which is connected to an upstream side of the current to be supplied from the external power source.

In one or more embodiments of the invention, a heat-generating electronic component may be mounted on a portion of the front surface of the board which overlaps with the electric motor in the axial direction. A heat transfer portion that transfers heat generated by the heat-generating electronic component to the rear surface of the board may be disposed immediately below the heat-generating electronic component in the board. An insulating heat radiation material may be disposed between a portion of the rear surface of the board which overlaps with the electric motor in the axial direction and a portion of the frame.

In one or more embodiments of the invention, the board may have a plurality of through-holes and a conductive portion electrically connected to the second ground pattern of the second ground layer around the through-holes. The frame may have a plurality of screw hole disposed coaxially with the through-holes, respectively. The load drive device may further include a plurality of screws made of a conductor. The screws may be inserted into the respective through-holes from the front surface of the board and screwed into the respective screw holes such that the board is fixed to the frame, and the screws may come into contact with the conductive portion and electrically connect the second ground pattern and the frame.

According to one or more embodiments of the invention, it is possible to realize miniaturization, to prevent a device malfunction, and to improve heat radiating performance and resistance to electromagnetic wave noise in a load drive device in which an electric motor and a controller are integrated with each other.

DETAILED DESCRIPTION

Figure 1:
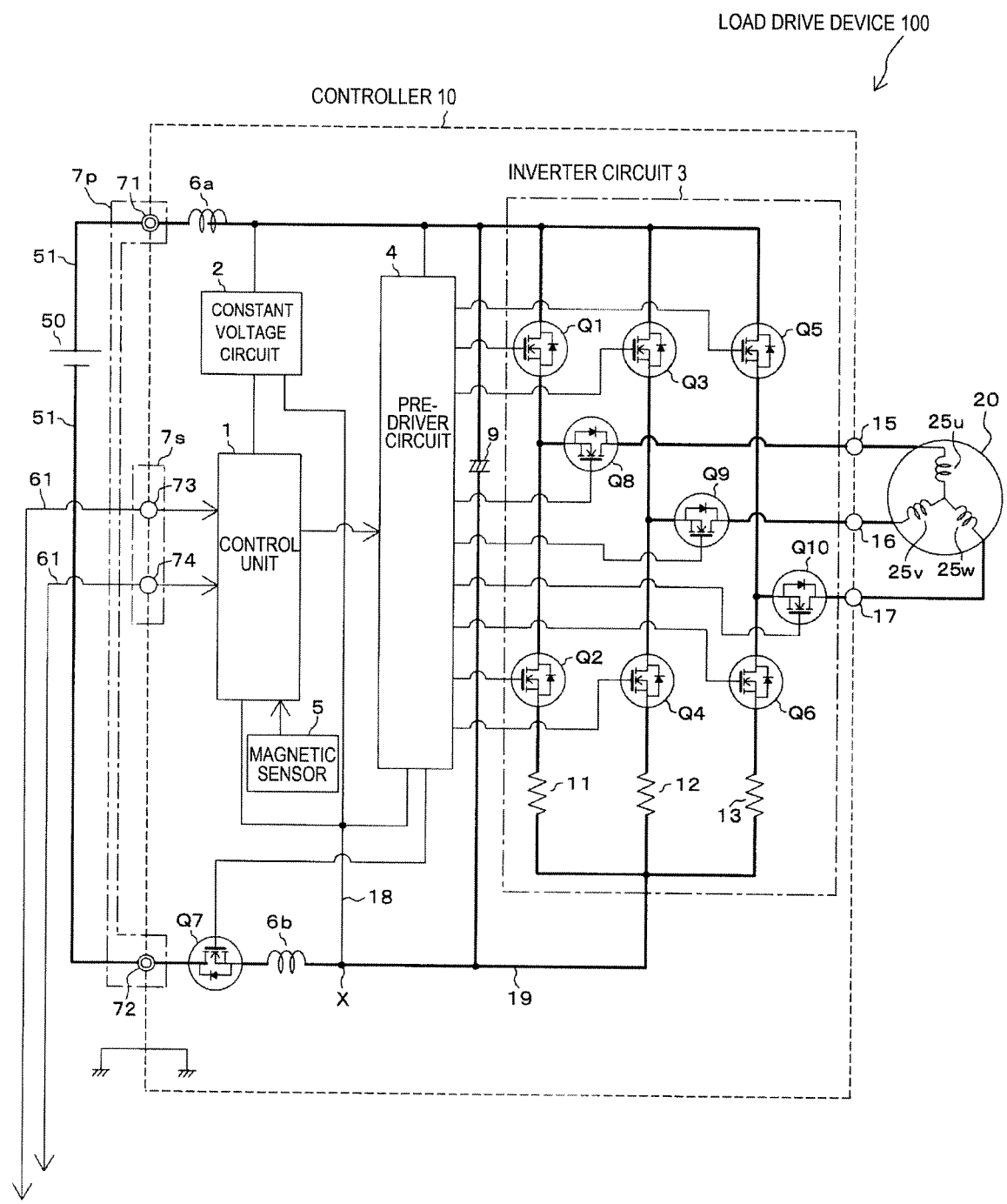
FIG. 1 is a circuit diagram illustrating an electrical configuration of a load drive device according to an embodiment of the invention.

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Hereinafter, one or more embodiments of the invention will be described with reference to the drawings. In each drawing, the same reference numerals will be given to the same elements or elements corresponding thereto.

First, an electrical configuration of a load drive device 100 according to the embodiment of the invention will be described with reference to FIG. 1.

FIG. 1 is a circuit diagram illustrating an electrical configuration of the load drive device 100. The load drive device 100 is configured to include a controller 10 and an electric motor 20, and both of these are mechanically integrated with each other as will be described later. The controller 10 has one board 33 (illustrated in FIG. 2) on which an electronic component configuring the drive circuit or the control circuit (to be described later) is mounted. The load drive device 100 is incorporated in an electric power steering system mounted on a vehicle such as a four-wheeled automobile, and causes the electric motor 20 to drive a steering mechanism (steering wheel and gear) which functions as a load, thereby assisting a steering operation. The electric motor 20 has a three-phase brushless motor.

The controller 10 includes a control unit 1, a constant voltage circuit 2, an inverter circuit 3, a predriver circuit 4, an electrolytic capacitor 9, a magnetic sensor 5, choke coils 6a and 6b, a power connector 7p, and an input/output connector 7s. An electric circuit of the controller 10 includes a drive circuit (such as the inverter circuit 3) for driving the electric motor 20 and a control circuit (such as the control unit 1) for controlling the electric motor 20. Details thereof will be described later.

The power connector 7p includes power terminals 71 and 72. The controller 10 and an in-vehicle battery 50 are electrically connected to each other via a first harness 51 electrically connected to the power terminals 71 and 72. Specifically, one power terminal 71 is connected to a cathode of the in-vehicle battery 50, and the other power terminal 72 is connected to an anode of the in-vehicle battery 50. The power terminal 72 is grounded to the ground. The in-vehicle battery 50 is an example of an "external power source" according to the embodiment of the invention.

The input/output connector 7s includes a plurality of signal terminals 73 and 74. The controller 10 is electrically connected to a torque sensor (not illustrated) or a controller area network (CAN) communication bus (not illustrated) disposed in the vehicle via a second harness 61 electrically connected to the signal terminals 73 and 74. A steering torque signal is input from the torque sensor to the controller 10 via the signal terminals 73 and 74 and the second harness 61. A vehicle speed signal of the vehicle is input to the controller 10 from a vehicle speed sensor (not illustrated) connected to the CAN communication bus, or information such as a failure diagnosis result is output from the controller 10. FIG. 1 illustrates only one each of the terminals 71 to 74. However, in actual, the plurality of terminals 71 to 74 are respectively provided (refer to FIG. 6 (to be described later)). The power connector 7p and the input/output connector 7s are an example of a "connector" according to the embodiment of the invention.

The control unit 1 has a microcomputer, and controls an operation of each portion of the controller 10. The control unit 1 transmits and receives a signal or information via the signal terminals 73 and 74 and the second harness 61 of the input/output connector 7s. The constant voltage circuit 2 steps down a voltage of the in-vehicle battery 50 so as to generate a predetermined voltage (for example, 5V), and supplies the predetermined voltage to the control unit 1.

The inverter circuit 3 is a known electric circuit which drives the electric motor 20 by supplying the current to the electric motor 20. The electrolytic capacitor 9 for a smoothing purpose is connected in parallel to the inverter circuit 3. One end of the inverter circuit 3 is connected to the cathode of the in-vehicle battery 50 via the choke coil 6a and the power terminal 71 of the power connector 7p. The other end of the inverter circuit 3 is connected to the anode of the in-vehicle battery 50 via the choke coil 6b, FET Q7 for preventing reverse connection, and the power terminal 72 of the power connector 7p. A gate of FET Q7 is connected to the predriver circuit 4. In a case where the cathode and the anode of the in-vehicle battery 50 are normally connected to the power terminals 71 and 72 as illustrated in FIG. 1, FET Q7 is turned on by a gate signal output from the predriver circuit 4. However, in a case where the cathode and the anode of the in-vehicle battery 50 are reversely connected to the power terminals 71 and 72, the gate signal is not output from the predriver circuit 4, and FET Q7 is not turned on.

The inverter circuit 3 includes field effect transistors (FETs) Q1 to Q6 for supplying the current, FETs Q8 to Q10 for blocking the current, and shunt resistors 11 to 13. FETs Q1 to Q6 and Q8 to Q10 are the semiconductor switching elements, and are the heat-generating electronic components having a great calorific value when power is supplied.

Each gate of FETs Q1 to Q6 and Q8 to Q10 is connected to the predriver circuit 4. The drain of FETs Q1, Q3, and Q5 is connected to the cathode of the in-vehicle battery 50 via the choke coil 6a and the power terminal 71. Sources of FETs Q1, Q3, and Q5 are respectively connected to drains of FETs Q2, Q4, and Q6 and sources of FETs Q8, Q9, and Q10. The drains of FETs Q8, Q9, and Q10 are respectively connected to a coil 25u having a U-phase of the electric motor 20, a coil 25v having a V-phase, and a coil 25w having a W-phase via the motor terminals 15 to 17. The sources of FETs Q2, Q4, and Q6 are respectively connected to one end of the shunt resistors 11, 12, and 13. The other end of the shunt resistors 11, 12, and 13 is connected to the anode of the in-vehicle battery 50 via a power system ground line 19, the choke coil 6b, FET Q7, and the power terminal 72. Although not illustrated, a connection point of FETs Q2, Q4, and Q6 and the shunt resistors 11, 12, and 13 is connected to the control unit 1, and the control unit 1 detects a voltage of the connection point. The control unit 1 controls the predriver circuit 4 so as to turn on and off FETs Q1 to Q6 for supplying the current by using pulse width modulation (PWM). In this manner, the current is supplied to the respective coils 25u, 25v, and 25w of the electric motor 20, or a flowing direction of the current is changed so as to control the driving of the electric motor 20. FETs Q8, Q9, and Q10 for blocking the current are normally turned on by the predriver circuit 4. However, when the current flowing to the respective coils 25u, 25v, and 25w of the electric motor 20 is urgently blocked, FETs Q8, Q9, and Q10 are turned off by the predriver circuit 4, based on a command of the control unit 1. A boost circuit is incorporated in the predriver circuit 4, and the voltage of the in-vehicle battery 50 is boosted so as to generate the voltage needed to drive each of FETs Q1 to Q6 and Q8 to Q10 of the inverter circuit 3.

As will be described later, the magnetic sensor 5 detects a change in a magnetic force of a magnet 22g disposed in a shaft 22a (FIG. 5) of a rotor 22 of the electric motor 20. The control unit 1 detects a rotation state of the rotor 22 of the electric motor 20, based on a detection signal output from the magnetic sensor 5.

The control unit 1, the constant voltage circuit 2, and the predriver circuit 4 are connected to a control system ground line 18. The inverter circuit 3 is connected to a power system ground line 19. The inverter circuit 3 and a wire thereof (thick solid line in FIG. 1) for driving the electric motor 20 by supplying the current to the electric motor 20 are an example of a drive system of the electric motor 20, that is, a "drive circuit" according to the embodiment of the invention. Specifically, the thick solid line in FIG. 1 indicates a path of a high current flowing in the electric motor 20, and indicates a wire forming a path through which the high current supplied from the power terminal 71 to the electric motor 20 via the choke coil 6a and the inverter circuit 3 is returns to the power terminal 72. In contrast, the control unit 1, the constant voltage circuit 2, the predriver circuit 4, the magnetic sensor 5, and wires thereof (thin solid line in FIG. 1) for controlling the driving of the electric motor 20 are an example of a control system of the electric motor 20, that is, a "control circuit" according to the embodiment of the invention. The current flowing in the drive system of the electric motor 20 is higher than the current flowing in the control system of the electric motor 20.

The control system ground line 18 and the power system ground line 19 are connected to each other so as to merge at a connection point X, are connected via the choke coil 6b, FET Q7, and the power terminal 72 to the anode of the in-vehicle battery 50, and are grounded to the ground. In this way, the control system ground line 18 and the power system ground line 19 merge only at one point X in the vicinity of the power terminal 72. This restrains a potential difference from occurring in various ground lines present in the control system of the electric motor 20. Accordingly, it is possible to prevent the control system from malfunctioning. In FIG. 1, the choke coil 6b and FET Q7 are disposed between the connection point X and the power terminal 72. However, as an alternative example, for example, the choke coil 6b and FET Q7 may be disposed between the connection point X and the inverter circuit 3, and the connection point X for connecting the control system ground line 18 and the power system ground line 19 to each other may be disposed closer to the power terminal 72. In this manner, the wire from the connection point X to the power terminal 72 is shortened, thereby reducing distribution line resistance thereof. Therefore, it is possible to minimize voltage drop which occurs when the high current flows in the wire.

Next, a mechanical configuration of the load drive device 100 will be described with reference to FIGS. 2 to 15.

Figure 2:
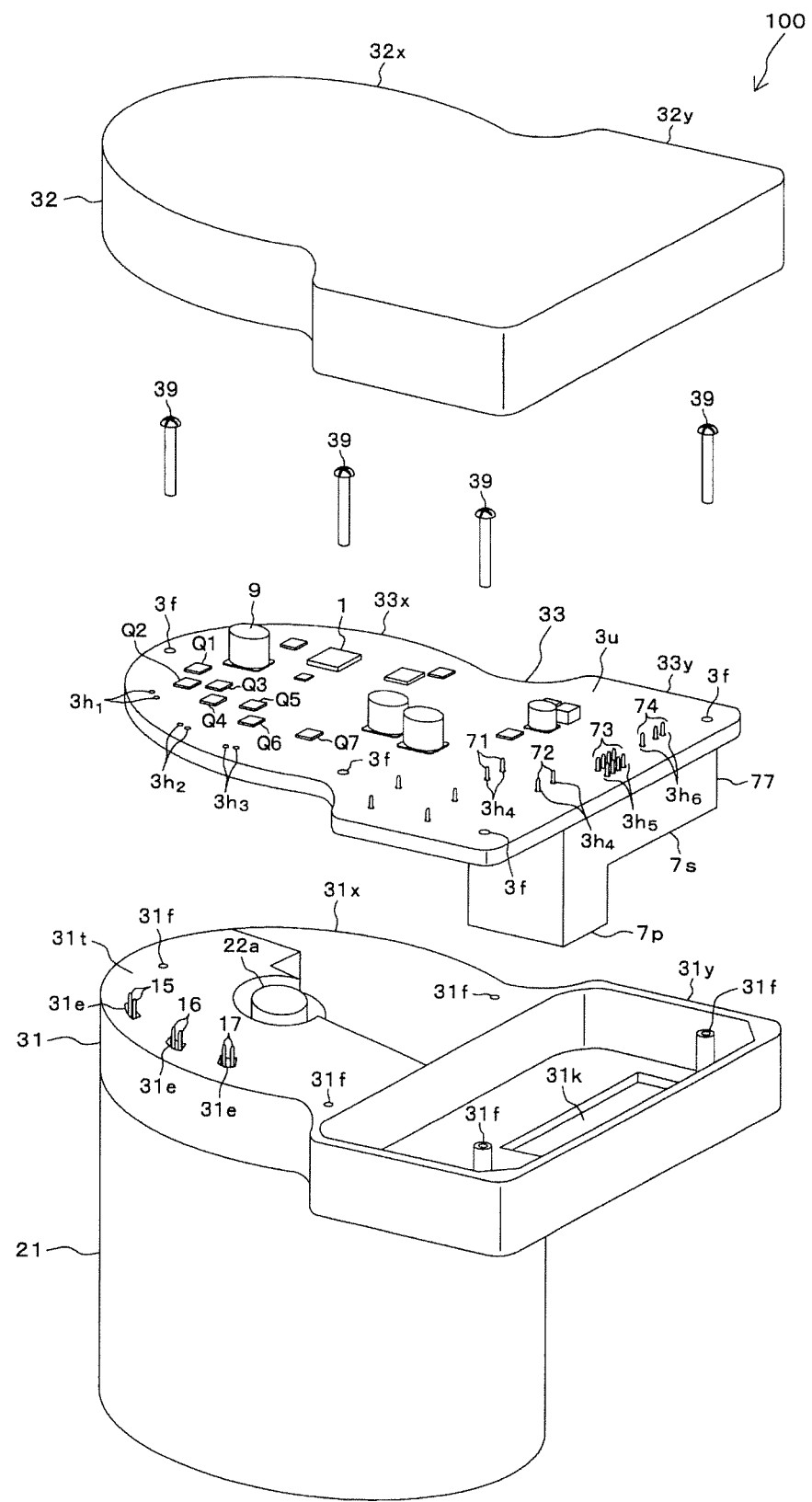
FIG. 2 is an exploded perspective view of the load drive device.
Figure 3:
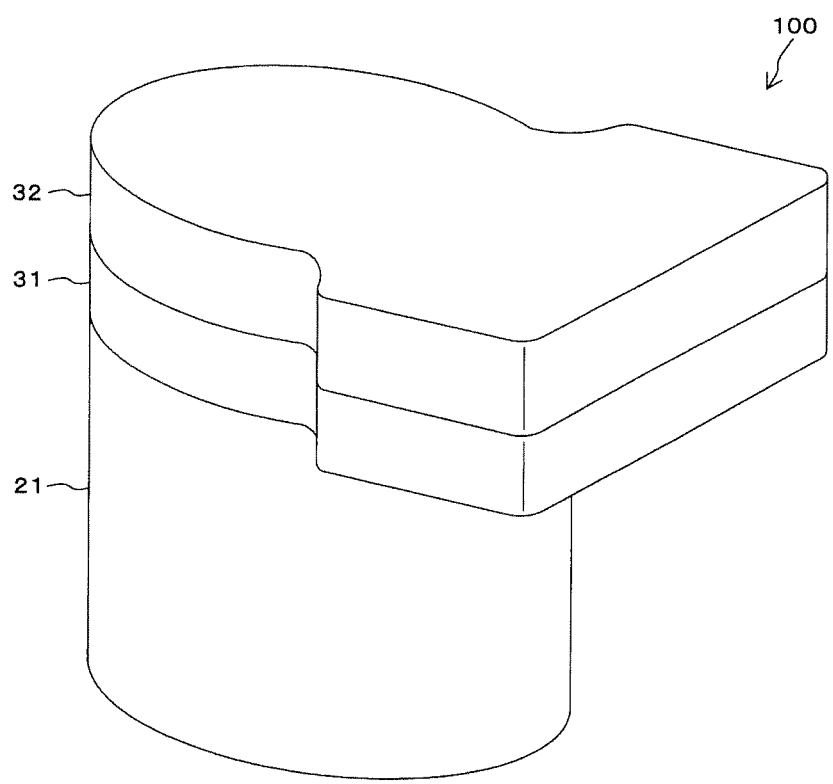
FIG. 3 is a perspective assembly view of the load drive device.
Figure 4:
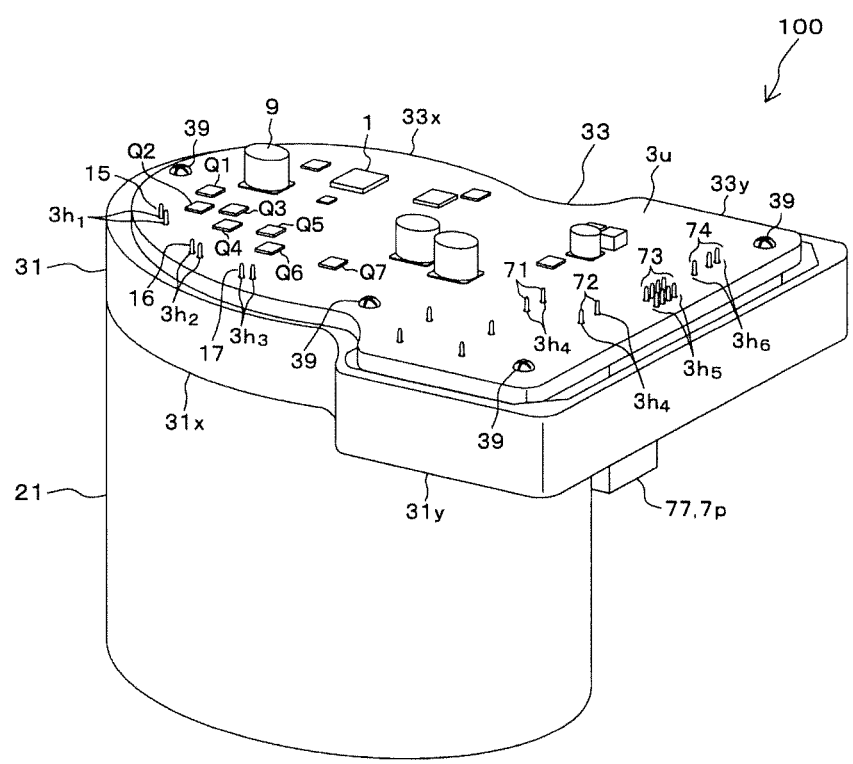
FIG. 4 is a perspective view illustrating a state where a cover is detached therefrom in FIG. 3.
Figure 5:
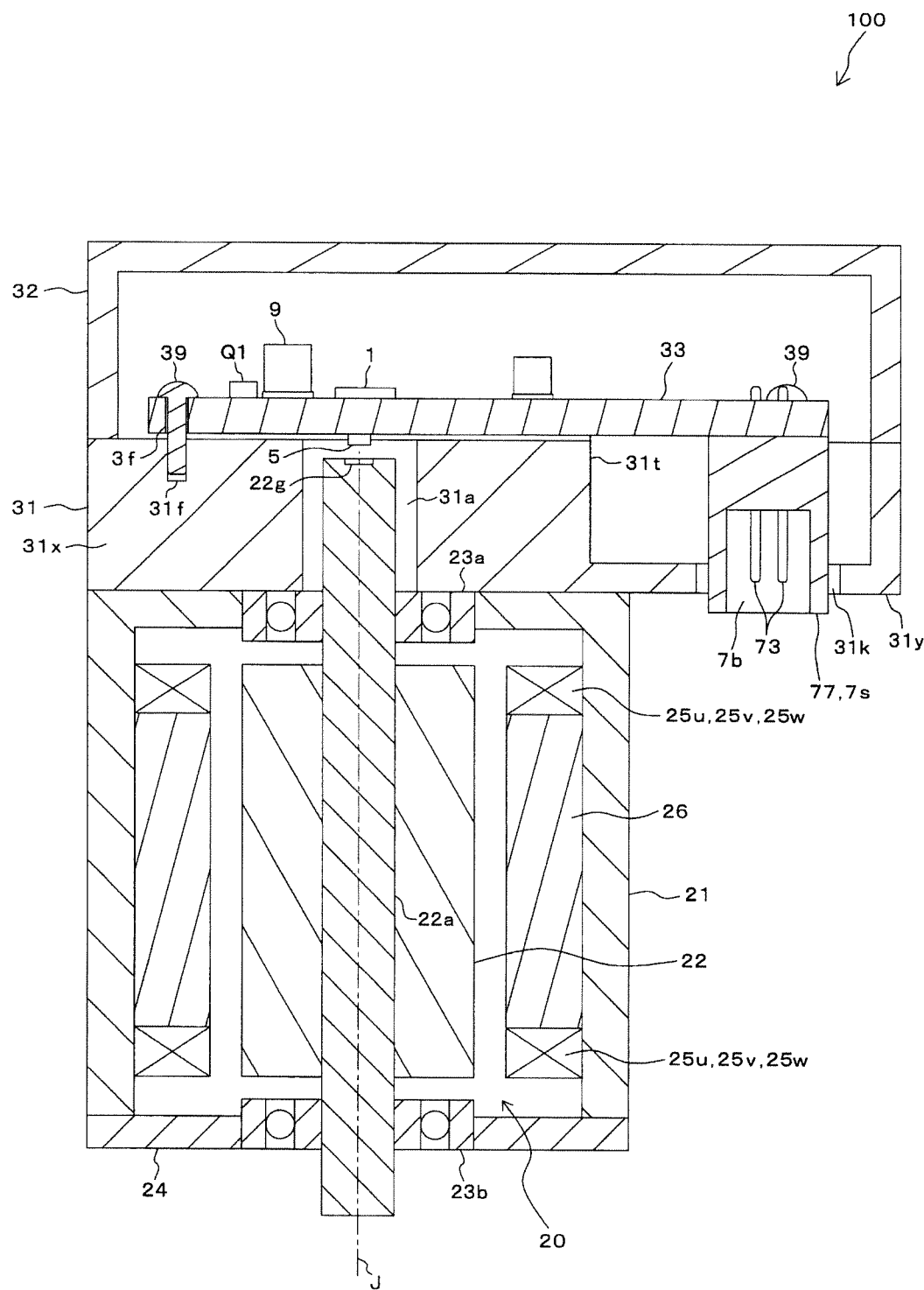
FIG. 5 is a longitudinal sectional view of the load drive device.

FIG. 2 is an exploded perspective view of the load drive device 100. FIG. 3 is a perspective assembly view of the load drive device 100. FIG. 4 is a perspective view illustrating a state in which the cover 32 is detached therefrom in FIG. 3. FIG. 5 is a longitudinal sectional view of the load drive device 100.

As illustrated in FIG. 3, the load drive device 100 includes a housing 21, a frame 31, and a cover 32.

The housing 21 is formed in a cylindrical shape, for example, by means of aluminum die casting, and is internally equipped with the electric motor 20 as illustrated in FIG. 5. A lower end portion of the housing 21 is closed by a bracket 24. The electric motor 20 has a stator 26, coils 25u, 25v, and 25w, a rotor 22, a bearing 23a, 23b, and motor terminals 15 to 17 (FIGS. 1, 2, and 4).

The stator 26 is formed in a cylindrical shape, and is attached to an inner surface of the housing 21. The coils 25u, 25v, and 25w are wound around the stator 26. A lower end portion of the motor terminals 15 to 17 is connected to each of the coils 25u, 25v, and 25w (not illustrated). FIGS. 2 and 4 illustrate each upper end portion of the motor terminals 15 to 17. The rotor 22 is disposed inside the stator 26. The rotor 22 includes the shaft 22a.

As the current flows into the coils 25u, 25v, and 25w via the motor terminals 15 to 17, the rotor 22 is rotated around a rotation axis J. Hereinafter, a direction parallel to the rotation axis J (vertical direction in FIG. 5) will be referred to as an "axial direction". Both end portions of the shaft 22a protrude from the housing 21 in the axial direction of the electric motor 20. The upper end portion of the motor terminals 15 to 17 also protrudes from the housing 21 in the axial direction of the electric motor 20.

The bearing 23b located below is fixed to the inside of the bracket 24, and rotatably holds the vicinity of the lower end portion of the shaft 22a. The bearing 23a above located above is fixed to the inside of the upper end portion of the housing 21, and rotatably holds the vicinity of the upper end portion of the shaft 22a.

The frame 31 is connected to the housing 21 on one side (upper side in FIG. 5) in the axial direction of the electric motor 20. The frame 31 is made of metal such as aluminum, and is also used as a heat sink. As an alternative example, the frame made of a synthetic resin which can also be used as the heat sink may be used. An upper end portion of the shaft 22a is inserted into a through-hole 31a formed at the center of the frame 31. The shaft 22a is separated from the frame 31.

The board 33 is fixed to an upper surface (surface on a side opposite to the electric motor 20) of the frame 31 by using a screw 39 so that the board 33 is perpendicular to the axial direction of the electric motor 20. As described above, the electronic component for driving and controlling the electric motor 20 is mounted on the board 33 configuring the controller 10 of FIG. 1.

Figure 6:
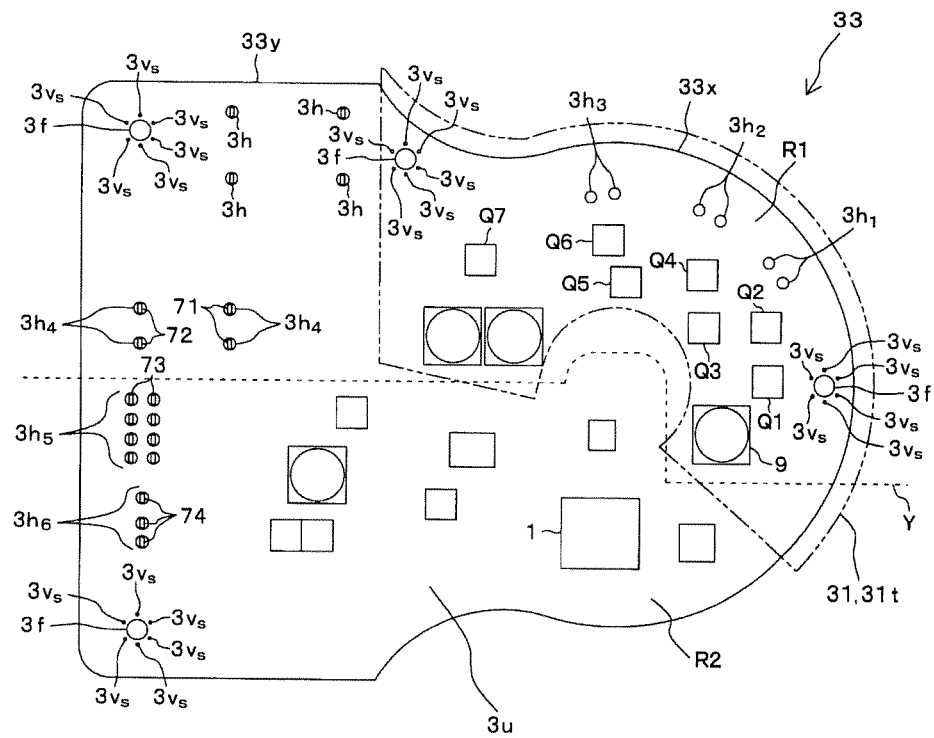
FIG. 6 illustrates a front surface of a board illustrated in FIG. 4.
Figure 7:
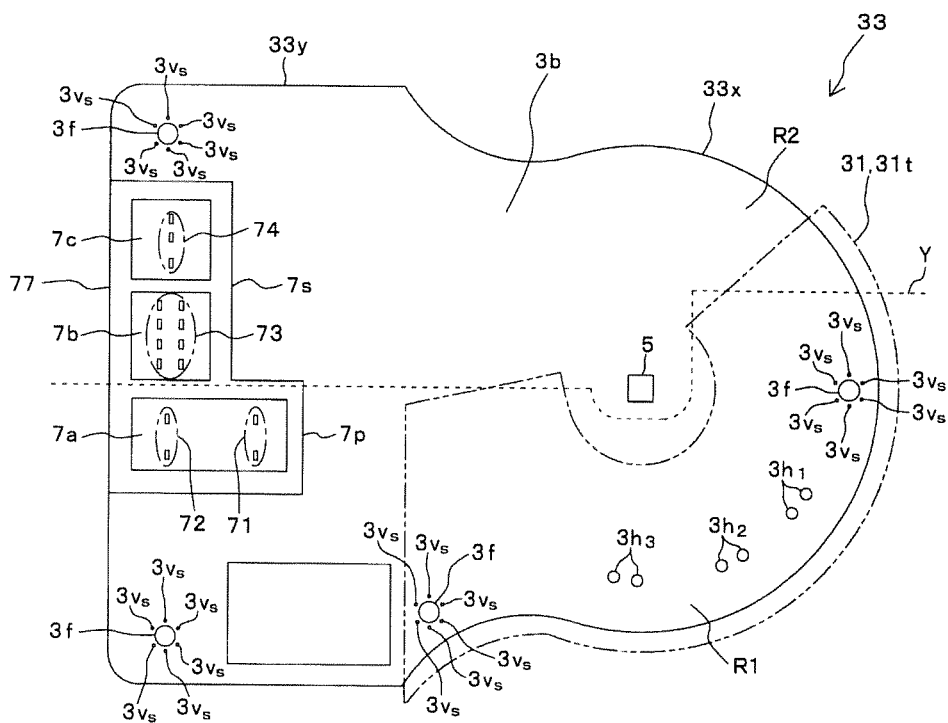
FIG. 7 illustrates a rear surface of the board illustrated in FIG. 4.

FIG. 6 illustrates a front surface (surface facing upward in FIGS. 2 and 4) 3u of the board 33. FIG. 7 illustrates a rear surface (surface facing downward in FIGS. 2 and 4) 3b of the board 33.

The board 33 has a circular portion 33x and a rectangular portion 33y protruding to one side in a radial direction of the circular portion 33x. In accordance with a shape of the board 33, the frame 31 and the cover 32 also respectively have circular portions 31x and 32x and rectangular portions 31y and 32y as illustrated in FIG. 2. An outer shape of the board 33 is smaller than an outer shape of the frame 31 and the cover 32.

The circular portions 31x and 32x of the frame 31 and the cover 32 have a diameter approximately equal to a diameter of the electric motor 20 (diameter perpendicular to the rotation axis J), and overlap with the electric motor 20 in the axial direction. The circular portion 33x of the board 33 has the diameter smaller than the diameter of the housing 21, and overlaps with the electric motor 20 in the axial direction. The rectangular portions 31y, 32y, and 33y of the frame 31, the cover 32, and the board 33 do not overlap with the electric motor 20 in the axial direction.

The cover 32 is attached to the upper portion of the frame 31 so as to cover the board 33 (refer to FIGS. 3 and 5). An internal space surrounded by the frame 31 and the cover 32 accommodates only one board 33 having the electronic component mounted thereon.

As illustrated in FIG. 2, the upper end portion of the motor terminals 15 to 17 penetrates a through-hole 31e disposed in the circular portion 31x of the frame 31. As illustrated in FIG. 4, the upper end portion of the motor terminals 15 to 17 is electrically connected to the circular portion 33x of the board 33. Specifically, the respective upper end portions of the motor terminals 15 to 17 are inserted into the respective through-holes 3h1, 3h2, and 3h3 formed in the circular portion 33x of the board 33, and are electrically connected by means of soldering. The motor terminals 15 to 17 and the frame 31 are electrically insulated from each other.

As illustrated in FIGS. 2, 4 and 6, the electronic components such as FETs Q1 to Q7, the electrolytic capacitor 9, and the control unit 1 (microcomputer chip) are mounted on a front surface 3u of the board 33. Out of these electronic components, at least FET Q1 to Q7, the electrolytic capacitor 9, and the control unit 1 (microcomputer chip) are arranged in the circular portion 33x. FETs Q8 to Q10 and FETs Q8 to Q10 are also mounted on the front surface 3u of the board 33. However, in FIGS. 2, 4, 6, and 9 to 14, FET Q8 to Q10 and a mounting position thereof are omitted in the illustration for the sake of convenience.

As illustrated in FIGS. 5 and 7, the electronic components such as the magnetic sensor 5, the power connector 7p, and the input/output connector 7s are mounted on a rear surface 3b of the board 33. The magnetic sensor 5 is located at a position facing the upper end portion of the shaft 22a of the electric motor 20, which is the center of the circular portion 33x of the rear surface 3b of the board 33. A magnet 22g is embedded in the upper end portion of the shaft 22a. In order to detect a rotation state of the rotor 22, the magnetic sensor 5 detects a change in the magnetic force of the magnet 22g. The magnetic sensor 5 is an example of a "rotation sensor" according the embodiment of invention.

The power connector 7p and the housing 77 of the input/output connector 7s are integrated with each other, and are arranged in the rectangular portion 33y of the rear surface 3b of the board 33. As illustrated in FIGS. 2 and 4, the upper end portions of the power connector 7p and the terminals 71 to 74 of the input/output connector 7s are respectively inserted into the plurality of through-holes $3h_4$, $3h_5$, and $3h_6$ formed on the board 33, and are electrically connected by means of soldering.

As illustrated in FIG. 7, the housing 77 has fitting portions 7a, 7b, and 7c. Among these, the lower end portion of the power terminals 71 and 72 protrudes into the fitting portion 7a. The lower end portion of the signal terminal 73 protrudes into the fitting portion 7b. The lower end portion of the signal terminal 74 protrudes into the fitting portion 7c. That is, the fitting portion 7a is the fitting portion of the power connector 7p, and the fitting portions 7b and 7c are the fitting portions of the input/output connector 7s.

As illustrated in FIG. 5, the housing 77 and the respective fitting portions 7a to 7c penetrate a through-hole 31k disposed in the rectangular portion 31y of the frame 31 so as to be exposed to the electric motor 20 side (lower side in FIG. 5). The first harness 51 (FIG. 1) for supplying the current from the in-vehicle battery 50 is fitted to the fitting portion 7a in the axial direction of the electric motor 20. The second harness 61 for communicating with an external device is fitted to the fitting portions 7b and 7c in the axial direction of the electric motor 20. The external device includes the above-described torque sensor or vehicle speed sensor. The fitting portion 7a is an example of a "first fitting portion" according to the embodiment of the invention, and the fitting portions 7b and 7c are an example of a "second fitting portion" according to the embodiment of the invention.

As illustrated in FIG. 2, on the front surface 3u of the board 33, the electrolytic capacitor 9 is mounted in the vicinity of FET Q1 located at a position farthest away from the power connector 7p among the plurality of FETs Q1 to Q7. The electrolytic capacitor 9 is connected in parallel with the inverter circuit 3 as illustrated in FIG. 1. Specifically, the electrolytic capacitor 9 and FETs Q1 to Q6 of the inverter circuit 3 are electrically connected by a wiring pattern (not illustrated) formed on the front surface 3u of the board 33. As described above, the inverter circuit 3 is driven using PWM by the predriver circuit 2. Accordingly, the current is greatly and transiently changed when FETs Q1 to Q6 are switched. Therefore, in FET Q1 which is located farthest away from the power terminal 71 of the power connector 7p and connected to the upstream side of the current supplied from the in-vehicle battery 50, the wiring pattern for being connected to the power terminal 71 is lengthened. Impedance and inductance of the wiring pattern increase, and the current is not sufficiently supplied from the in-vehicle battery 50 during the switching. However, the electrolytic capacitor 9 is located in the vicinity of FET Q1. In this manner, it is possible to sufficiently supply the current to FET Q1 during the switching. The same advantageous effect may be obtained by disposing the electrolytic capacitor in the vicinity of FET Q3 or FET Q5 on the upstream side, which is located closer to the power terminal 71 than FET Q1.

Figure 8:
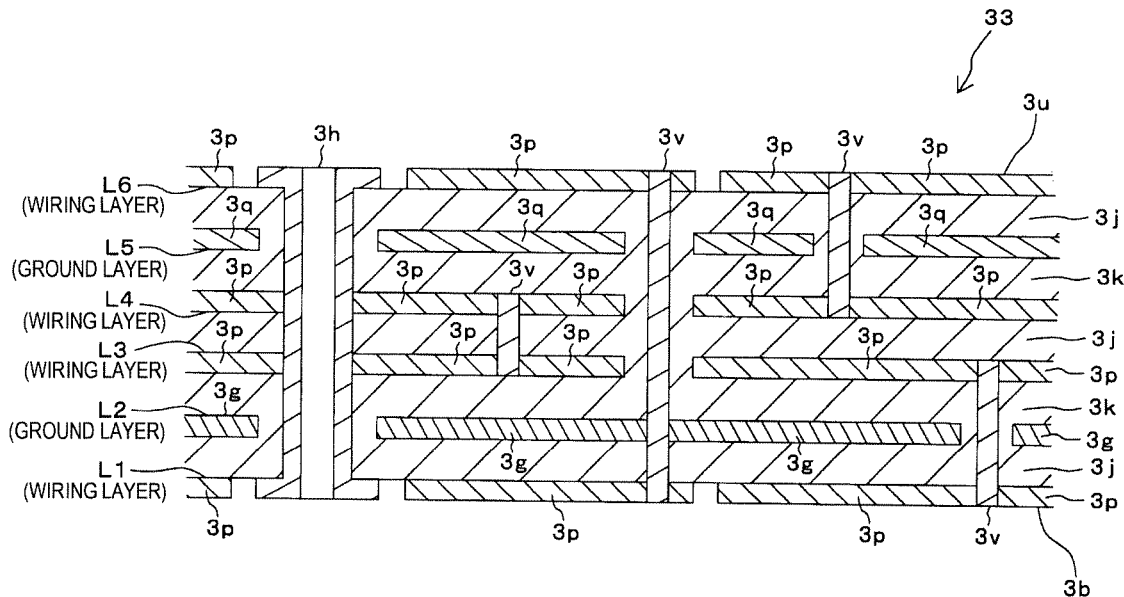
FIG. 8 is a sectional view of the board illustrated in FIG. 4.

FIG. 8 is a simplified view illustrating a cross-sectional structure of the board 33. The board 33 is a six-layer printed board in which six conductor layers L1 to L6 are stacked one on another via an insulation layer. In general, a printed board having four or more layers is called a multilayer printed board. The insulation layer is formed of an insulation base material 3j or a prepreg 3k.

Out of the six conductor layers, a first layer L1 disposed on the rear surface 3b of the board 33, a sixth layer L6 disposed on the front surface 3u, and a third layer L3 disposed and a fourth layer L4 which are disposed inside the board 33 are the wiring layers respectively having a wiring pattern (conductor) 3p. The second layer L2 disposed inside the board 33 is a ground layer having a ground pattern (conductor) 3g. The fifth layer L5 disposed inside the board 33 is also a ground layer having a ground pattern (conductor) 3q. However, as will be described later, the ground pattern 3q has a function different from that of the ground pattern 3g. Accordingly, for the sake of convenience, hereinafter, the fifth layer L5 will be referred to as a case ground layer. The respective layers L1, L2, L3, L4, L5, and L6 are arranged in this order from the rear surface 3b of the board 33 toward the front surface 3u.

Each portion of the board 33 has a plurality of through-holes 3h and vias 3v for electrically connecting patterns having different layers. The via 3v has a diameter smaller than that of the through-hole 3h, and is also called a through-hole via. Through-holes $3h_1$ to $3h_3$ described above and through-holes $3h_4$ to $3h_6$ to be described later are examples of the through-hole 3h. A thermal via group $3v_t$ and a through-hole via $3v_s$ to be described later are examples of the via 3v. The through-hole 3h and the via 3v are examples of an "interlayer connection wire" according to the embodiment of the invention. As an alternative example, for example, a metal columnar body may be embedded in the board 33 as the interlayer connection wire.

The electric circuit of the controller 10 (FIG. 1) is configured to include the wiring patterns 3p disposed in the wiring layers L1, L3, L4, and L6, the electronic component (FIGS. 6 and 7) mounted on the front surface 3u and the rear surface 3b of the board 33, and the through-hole 3h and the via 3v for electrically connecting the wiring patterns 3p having different layers to each other.

The ground pattern 3g disposed in the second layer L2 is a ground pattern for a circuit which is electrically connected to the wiring pattern 3p of a portion of the respective wiring layers L1, L3, L4, and L6. FIG. 8 illustrates an example in which the ground pattern 3g of the second layer L2 and the wiring pattern 3p of the first layer L1 and the sixth layer L6 are electrically connected to each other by the via 3v. The second layer L2 is an example of a "first ground layer" according to the embodiment of the invention. The ground pattern 3g is an example of the "first ground pattern" according to the embodiment of the invention. The ground pattern 3g for the circuit may also be disposed in the wiring layers L1, L3, L4, and L6.

The ground pattern 3q disposed in the fifth layer L5 is a ground pattern for electromagnetic wave noise resistance which is electrically connected to the frame 31, and is electrically insulated from the patterns 3p and 3g formed in the other layers L1 to L4, and L6. The fifth layer L5 is an example of a "second ground layer" according to the embodiment of the invention. The ground pattern 3q is an example of the "second ground pattern" according to the embodiment of the invention.

Figure 9:
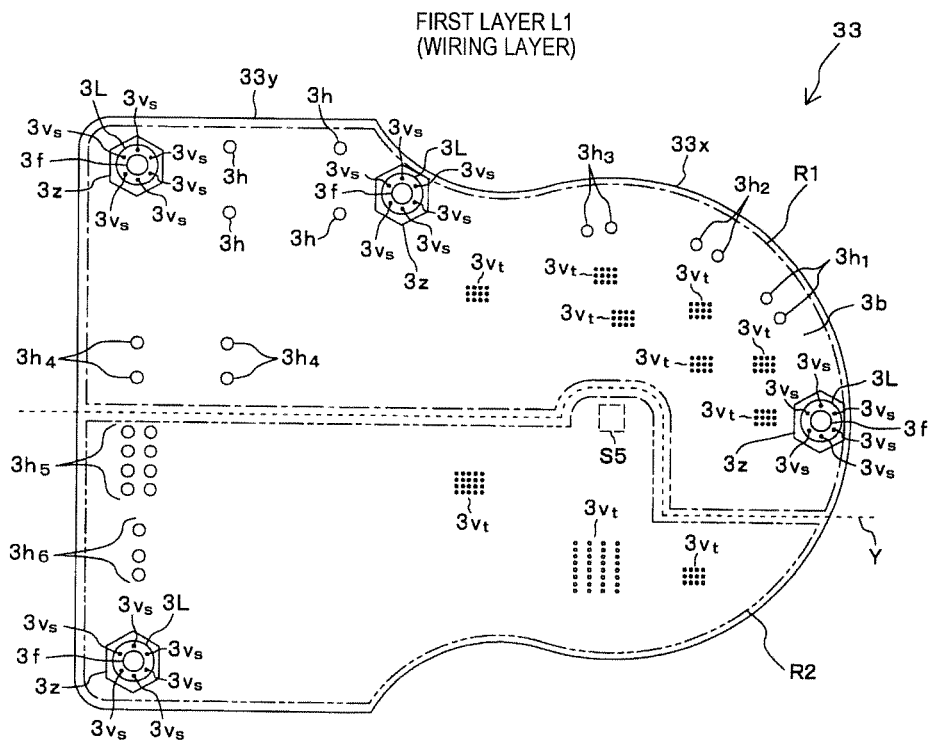
FIG. 9 is a plan view of a first layer of the board illustrated in FIG. 8.
Figure 10:
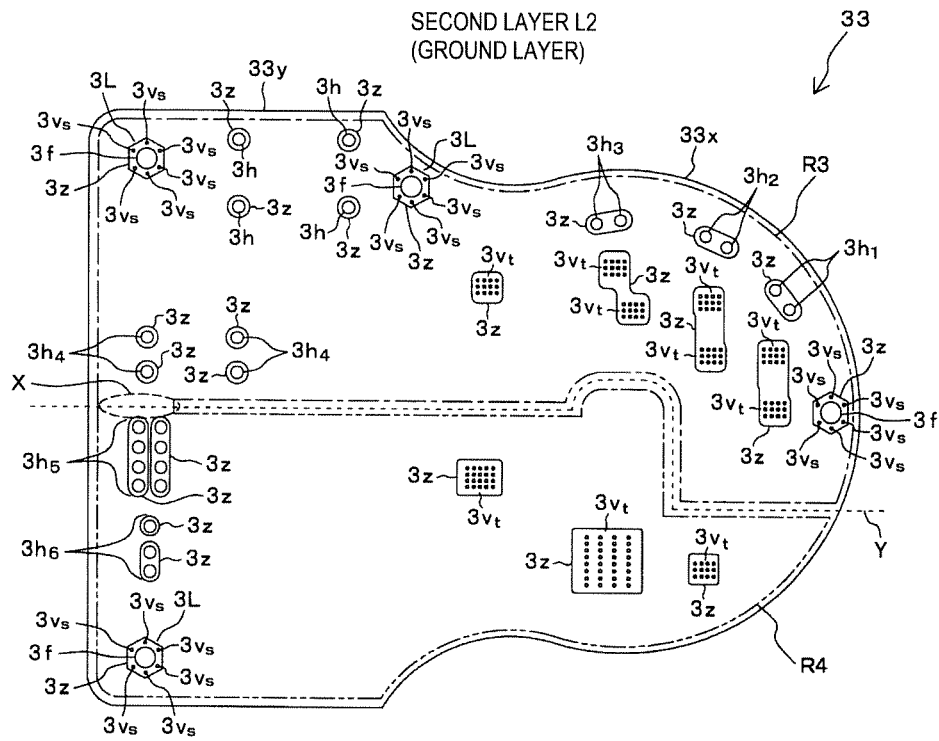
FIG. 10 is a plan view of a second layer of the board illustrated in FIG. 8.
Figure 11:
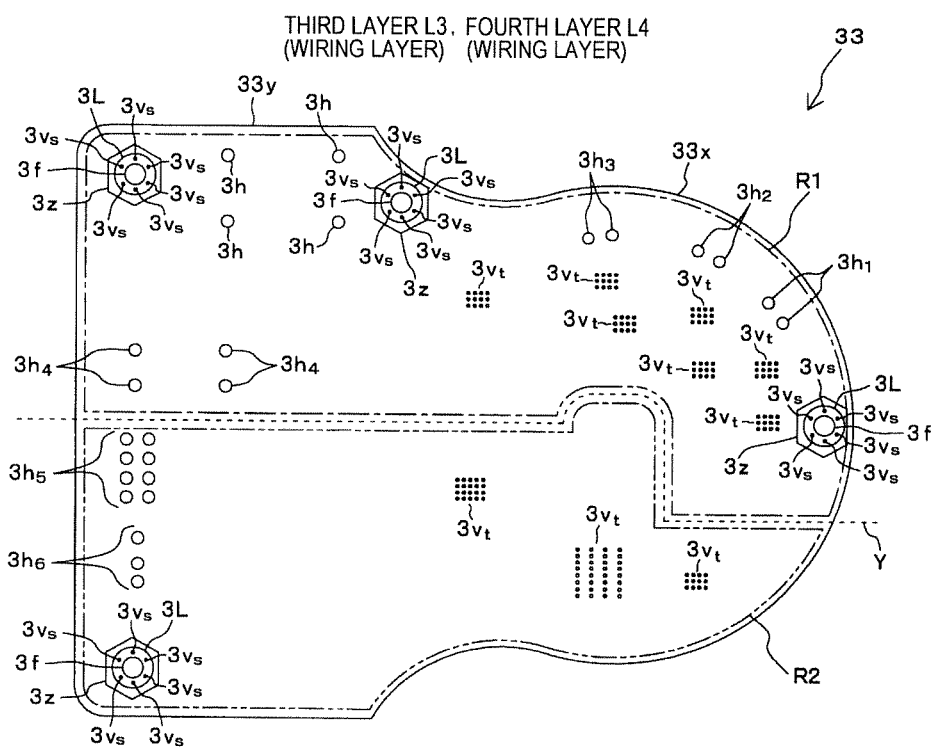
FIG. 11 is a plan view of a third layer and a fourth layer of the board illustrated in FIG. 8.
Figure 12:
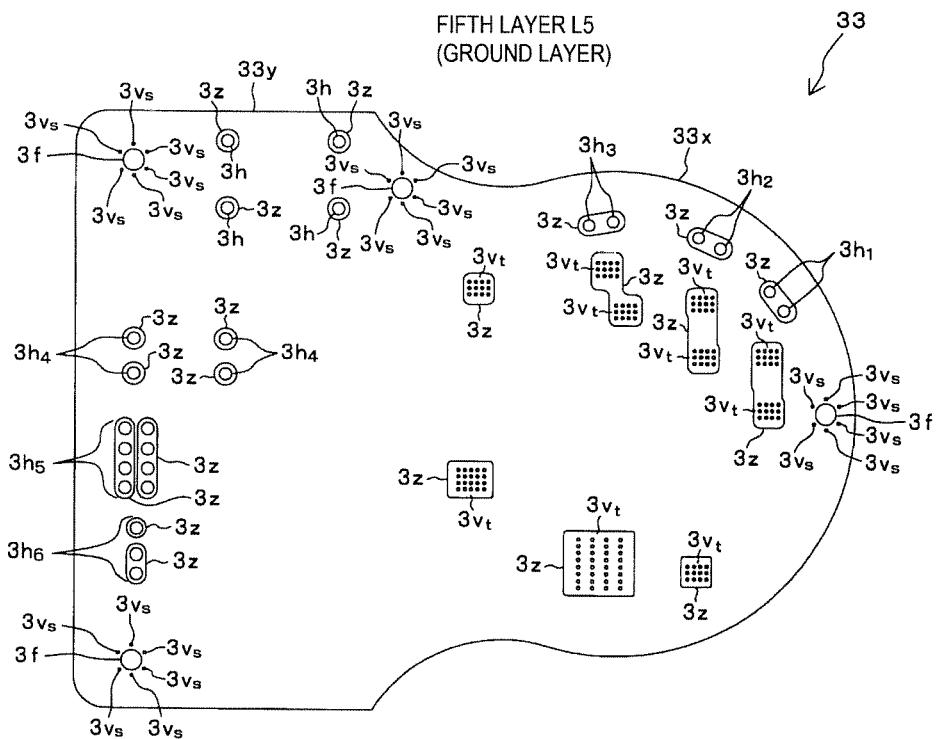
FIG. 12 is a plan view of a fifth layer of the board illustrated in FIG. 8.
Figure 13:
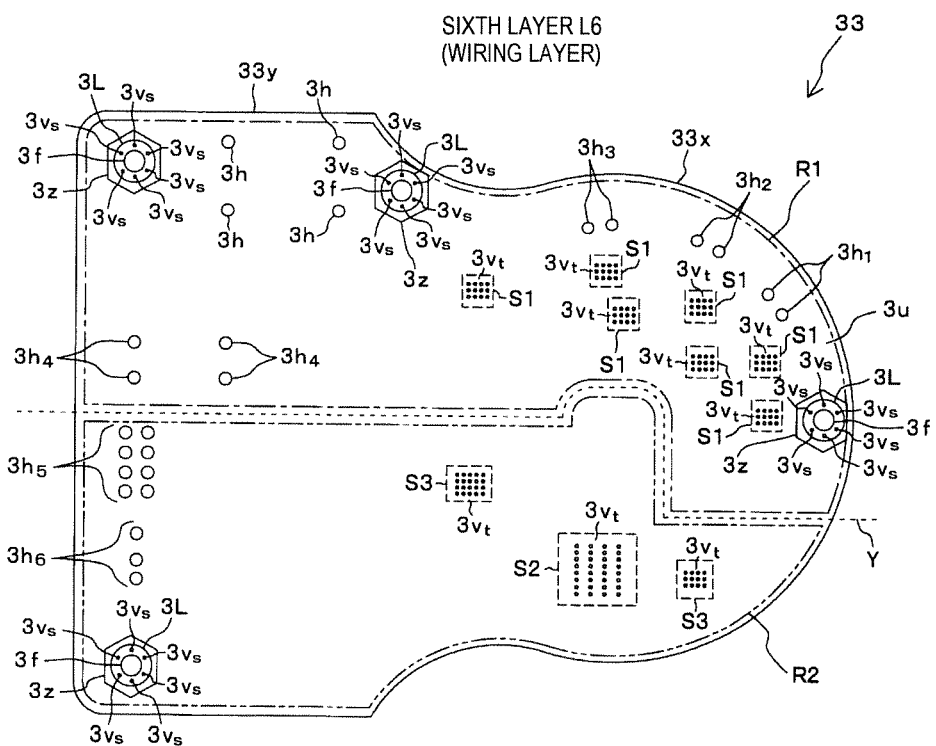
FIG. 13 is a plan view of a sixth layer of the board illustrated in FIG. 8.

FIG. 9 is a plan view of the first layer L1 of the board 33. FIG. 10 is a plan view of the second layer L2 of the board 33. FIG. 11 is a plan view of the third layer L3 and the fourth layer L4 of the board 33. FIG. 12 is a plan view of the fifth layer L5 of the board 33. FIG. 13 is a plan view of the sixth layer L6 of the board 33. For the sake of convenience, FIGS. 9 to 13 illustrate a state where the respective layers L1 to L6 are viewed from above. FIGS. 9 to 13 illustrate only a main portion of the respective layers L1 to L6, and details of the patterns 3p, 3g, and 3q in FIG. 8 are omitted in the illustration.

As illustrated in FIG. 9, in the first layer L1 disposed on the rear surface 3b of the board 33, the magnetic sensor 5 is mounted on a center position S5 of the circular portion 33x (refer to FIG. 7). Based on the center position S5, a first region R1 surrounded by a one-dot chain line on one side (upper side in FIG. 9) which does not include the magnetic sensor 5 and a second region R2 surrounded by a two-dot chain line on the other side (lower side in FIG. 9) including the magnetic sensor 5 are divided by widening an interval of the wiring patterns. A dotted line Y is a dividing line between the first region R1 and the second region R2. The first region R1 has the drive circuit (the inverter circuit 3 and a wire indicated by a thick solid line in FIG. 1) of the electric motor 20. The second region R2 has the control circuit (the control unit 1, the constant voltage circuit 2, the predriver circuit 4, the magnetic sensor 5, and a wire indicated by a thin solid line in FIG. 1) of the electric motor 20. The wiring pattern for the drive circuit and the wiring pattern for the control circuit are connected to each other between the first region R1 and the second region R2 (not illustrated).

As illustrated in FIGS. 11 and 13, similar to the first layer L1, the third layer L3, the fourth layer L4, and the sixth layer L6 which are the other wiring layers are divided into the first region R1 having the drive circuit of the electric motor 20 and the second region R2 having the control circuit of the electric motor 20. In a case of being projected in the thickness direction (axial direction of the electric motor 20) of the board 33 from above the board 33, the first regions R1 of the respective wiring layers L1, L3, L4, and L6 overlap with one another in the thickness direction of the board 33, and the second regions R2 of the respective wiring layers L1, L3, L4, and L6 also overlap with one another in the thickness direction of the board 33.

In FIG. 7, on the rear surface 3b of the board 33, the lower side of the dividing line Y is the first region R1, and the upper side of the dividing line Y is the second region R2. In FIG. 6, on the front surface 3u of the board 33, the upper side of the dividing line Y is the first region R1, and the lower side of the dividing line Y is the second region R2.

As illustrated in FIG. 10, the second layer (ground layer) L2 disposed inside the board 33 is divided into the third region R3 (region surrounded by the one-dot chain line) overlapping with the first region R1 of the respective wiring layers L1, L3, L4, L6 in the thickness direction of the board 33 and the fourth region R4 (region surrounded by the two-dot chain line) overlapping with the second region R2 of the respective wiring layers L1, L3, L4, and L6 in the thickness direction of the board 33.

The third region R3 has the ground pattern (3g in FIG. 8) for the power system electrically connected to the drive circuit of the first region R1. The ground pattern for the power system includes the power system ground line 19 illustrated in FIG. 1. The fourth region R4 has the ground pattern (3g in FIG. 8) for the control system electrically connected to the control circuit of the second region R2. The ground pattern for the control system includes the control system ground line 18 illustrated in FIG. 1. The interval is widened between the ground pattern for the power system and the ground pattern for the control system. In this manner, the third region R3 and the fourth region R4 are divided.

As illustrated in FIG. 12, the fifth layer (case ground layer) L5 disposed inside the board 33 is not divided into a plurality of regions. The fifth layer L5 has the ground pattern (3q in FIG. 8) for the electromagnetic wave noise resistance. The ground pattern for the electromagnetic wave noise resistance is formed on substantially the entire surface of the board 33, except for a portion where the interlayer connection wire and the screw hole are formed.

As illustrated in FIG. 9, the through-holes $3h_1$ to $3h_3$ for electrically connecting the motor terminal 15 to 17 are disposed in an outer edge portion belonging to the first region R1 of the circular portion 33x of the board 33. The respective through-holes $3h_1$ to $3h_3$ penetrate the board 33 as illustrated in FIG. 9 to FIG. 13. Each connection state of the respective motor terminals 15 to 17 connected to the respective through-holes $3h_1$ to $3h_3$ is as illustrated in FIG. 4.

The respective through-holes $3h_1$ to $3h_3$ are electrically connected to at least any one of the wiring patterns 3p (FIG. 8) disposed in the first region R1 of the wiring layers L1, L3, L4, and L6 illustrated in FIGS. 9, 11, and 13. As illustrated in FIGS. 10 and 12, in the ground layer L2 and the case ground layer L5, the through-hole $3h_1$ to $3h_3$ are surrounded by an insulation portion 3z (portion having no conductor such as the ground pattern 3g). The respective through-holes $3h_1$ to $3h_3$ are electrically insulated from the ground patterns 3g and 3q (FIG. 8) disposed in the ground layer L2 and the case ground layer L5.

As illustrated in FIGS. 9 to 13, an end portion of the rectangular portion 33y of the board 33 has the plurality of through-holes $3h_4$ to $3h_6$ for electrically connecting the terminals 71 to 74 of the connectors 7p and 7s. The respective through-holes $3h_4$ to $3h_6$ penetrate the board 33. Each connection state of the terminals 71 to 74 connected to the respective through-holes $3h_4$ to $3h_6$ is as illustrated in FIG. 2 and FIG. 4.

The respective through-holes $3h_4$ to $3h_6$ are electrically connected to at least any one of the wiring patterns 3p (FIG. 8) disposed in the first region R1 of the wiring layers L1, L3, L4, and L6 illustrated in FIGS. 9, 11, and 13. As illustrated in FIGS. 10 and 12, in the ground layer L2 and the case ground layer L5, the through-holes $3h_4$ to $3h_6$ are surrounded by the insulation portion 3z. The respective through-holes $3h_4$ to $3h_6$ are electrically insulated from the ground patterns 3g and 3q (FIG. 8) disposed in the ground layer L2 and the case ground layer L5. As an alternative example, at least any one of the through-holes 3h4 to 3h6 may be electrically connected to the ground pattern of the second layer L2.

As illustrated in FIG. 10, in the second layer L2, the connection point X connecting the ground pattern for the power system disposed in the third region R3 and the ground pattern for the control system disposed in the fourth region R4 is disposed between the through-hole 3h4 and the through-hole 3h5 connecting the terminals 71 to 73. At the connection point X, the power system ground line 19 (ground pattern for the power system) and the control system ground line 18 (ground pattern for the control system) which are illustrated in FIG. 1 merge, thereby electrically connecting both of these to each other.

As illustrated in FIG. 6, the plurality of electronic components are mounted on the front surface 3u of the board 33. Out of the electronic components, FETs Q1 to Q10 and the control unit (microcomputer chip) 1 are present as the above-described heat-generating electronic component having the great calorific value when the power is supplied thereto. As illustrated in FIG. 13, the thermal via group $3v_t$ is disposed at positions S1 to S3 where the heat-generating electronic component is mounted on the front surface 3u of the board 33. In the thermal via group $3v_t$, multiple vias 3v disposed so as to penetrate the board 33 are intensively disposed. FETs Q1 to Q7 are mounted at the mounting position S1 in FIG. 13. The control unit 1 is mounted at the mounting position S2, and the other heat-generating electronic component is mounted at the mounting position S3. The above-described FETs Q8 to Q10 are mounted in the vicinity of FETs Q1 to Q7 on the front surface 3u of the board 33.

That is, the thermal via group $3v_t$ is disposed in the board 33 immediately below the heat-generating electronic components. The thermal via group 3v1 transfers the heat generated from the heat-generating electronic components located immediately above from the front surface 3u side to the rear surface 3b side of the board 33. The heat transferred to the rear surface 3b side of the board 33 by the thermal via group $3v_t$ is radiated outward by the frame 31 (FIG. 2) which also serves as the heat sink. The thermal via group $3v_t$ is an example of a "heat transfer portion" according to the embodiment of the invention.

The respective thermal via groups $3v_t$ are electrically connected to at least one of the wiring patterns 3p (FIG. 8) disposed in the wiring layers L1, L3, L4, and L6 illustrated in FIGS. 9, 11, and 13. As illustrated in FIGS. 10 and 12, in the ground layer L2 and the case ground layer L5, the respective thermal via groups $3v_1$ are surrounded by the insulation portion 3z. The respective thermal via groups $3v_t$ are electrically insulated from the ground patterns 3g and 3q (FIG. 8) disposed in the ground layer L2 and the case ground layer L5.

Out of the heat-generating electronic components, FETs Q1 to Q10 particularly have the greater calorific value. Among FETs Q1 to Q10, FETs Q1 to Q7 are mounted in the first region R1 of the circular portion 33x on the front surface 3u of the board 33 as illustrated in FIG. 6. A protrusion 31t is formed in the circular portion 31x of the frame 31 so as to overlap with the first region R1 of the circular portion 33x of the board 33 in the axial direction of the electric motor 20 (refer to FIGS. 2, 5, and 6). The protrusion 31t is formed in a fan shape in a plan view. The upper surface of the protrusion 31t is parallel to the board 33. FETs Q1 to Q7, the thermal via group $3v_t$ located immediately below FETs Q1 to Q7, the first region R1 of the circular portion 33x of the board 33, the protrusion 31t of the frame 31 and the electric motor 20 are arranged so as to overlap with each other in the axial direction of the electric motor 20.

Figure 14:
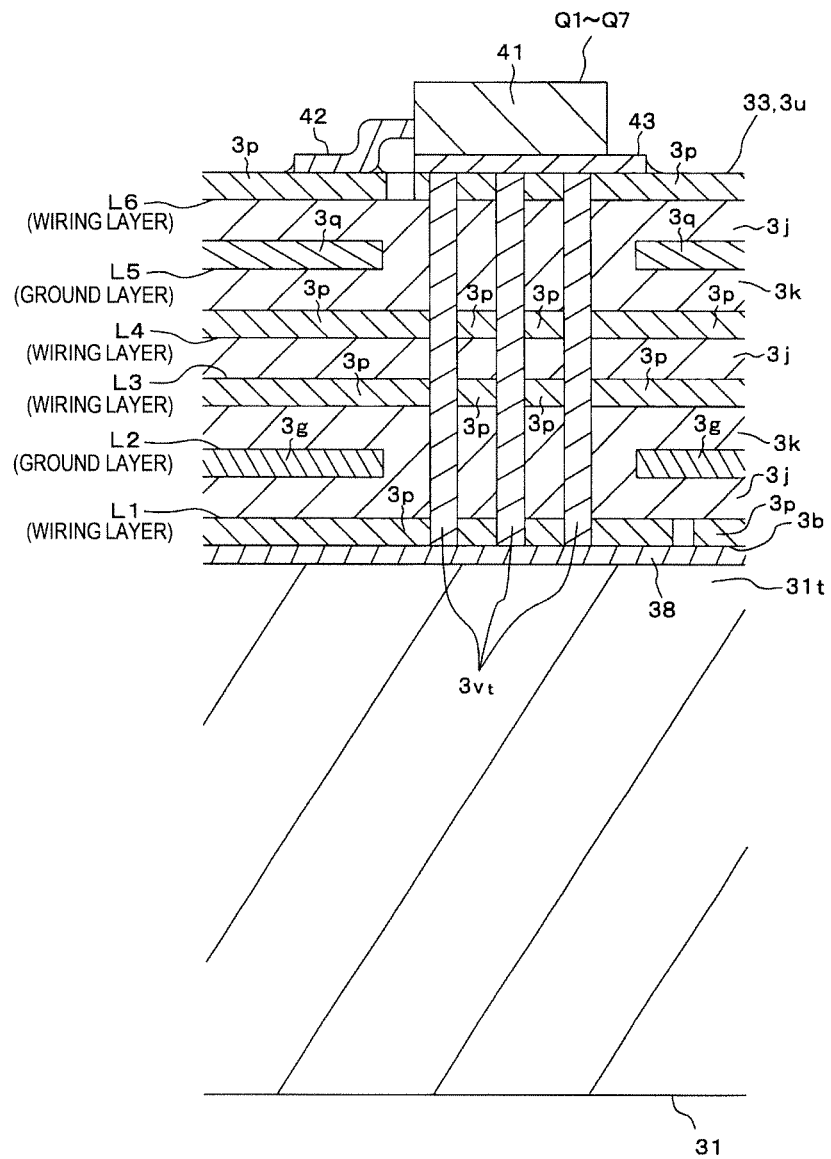
FIG. 14 is a sectional view illustrating a thermal connection state among FET, the board, and a frame which are illustrated in FIG. 4.

FIG. 14 is a sectional view illustrating a thermal connection state of FETs Q1 to Q7, the board 33, and the frame 31. FETs Q1 to Q7 include a main body portion 41, a terminal 42 laterally protruding from the main body portion 41, and a heat radiation plate 43 connected to a bottom surface of the main body portion 41. The terminal 42 is electrically connected to the wiring pattern 3p disposed on the front surface 3u (sixth layer L6) of the board 33 by means of soldering. The heat radiation plate 43 is electrically connected to the other wiring pattern 3p disposed on the front surface 3u of the board 33 by means of soldering. The thermal via group $3v_t$ is disposed below the main body portion 41 and the heat radiation plate 43 so as to penetrate the board 33.

The thermal via group $3v_t$ is electrically connected to the wiring pattern 3p disposed in the wiring layers L1, L3, L4, and L6, and is electrically insulated from the ground patterns 3g and 3q disposed in the ground layer L2 and the case ground layer L5. A portion of the rear surface 3b of the board 33 and the protrusion 31t of the frame 31 are located below FETs Q1 to Q7 and the thermal via group $3v_t$. An insulating heat radiation material 38 is interposed between the portion of the rear surface 3b and the protrusion 31t. The insulating heat radiation material 38 is formed of thermal grease or a heat radiation/insulation sheet. The insulating heat radiation material 38 thermally connects the portion of the rear surface 3b of the board 33 and the protrusion 31t of the frame 31 to each other, and electrically insulates both of these from each other.

Therefore, the heat generated from FETs Q1 to Q7 mounted on the front surface 3u of the board 33 is efficiently transferred to the protrusion 31t of the frame 31 via the heat radiation plate 43, the wiring pattern 3p of the sixth layer L6, the thermal via group $3v_t$, and the insulating heat radiation material 38. The heat generated in FETs Q8 to Q10 is also radiated by a heat radiation structure which is the same as that of FETs Q1 to Q7 described above.

The other through-hole 3h and the via 3v (excluding the through-hole via $3v_5$ (to be described later)) which electrically connect the patterns 3p and 3g disposed in the different layers L1 to L4, and L6 other than the above-described fifth layer L5 are also electrically insulated from the ground pattern 3q of the fifth layer L5.

As illustrated in FIGS. 2 and 9 to 13, a plurality of through-holes 3f are disposed at a predetermined interval in an end portion of the board 33. The screw 39 (FIGS. 2 and 5) for fixing the board 33 to the frame 31 is inserted into each of the through-holes 3f. As illustrated in FIGS. 2 and 5, a plurality of screw holes 31f for being screwed to the screws 39 are disposed coaxially with the through-holes 3f at a predetermined intervals in an end portion of the frame 31. The screw 39 is formed using the conductor. As illustrated in FIGS. 9 to 13, the plurality of through-hole vias $3v_5$ are disposed around each of the through-holes 3f. Each of the through-hole vias $3v_5$ penetrates the board 33.

Figure 15:
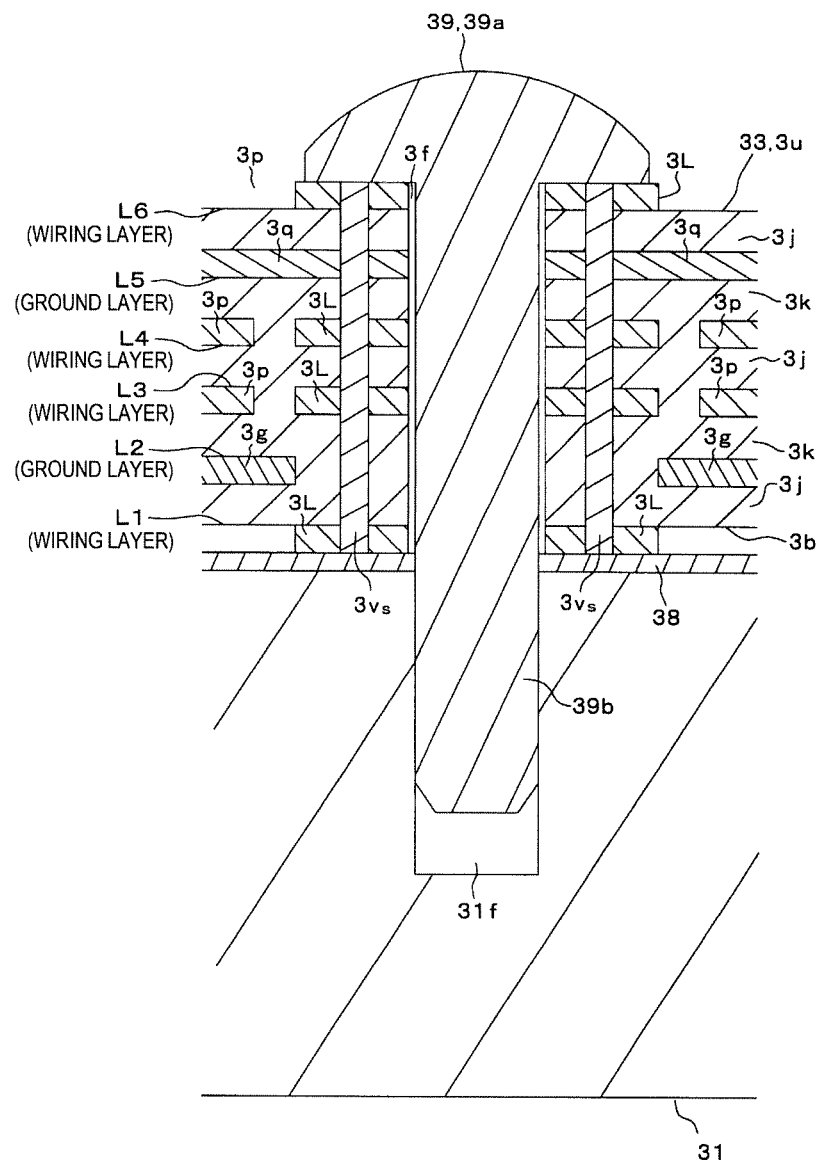
FIG. 15 is a sectional view illustrating an electrical connection state among a screw, the board, and the frame which are illustrated in FIG. 4.

FIG. 15 is a sectional view illustrating an electrical connection state of the screw 39, the board 33, and the frame 31. As illustrated in FIGS. 9, 11, 13, and 15, a land (conductor) 3L is disposed around the through-hole 3f in the respective wiring layers L1, L3, L4, and L6. The land 3L is surrounded by the insulation portion 3z. The through-hole via $3v_s$ is electrically connected to the land 3L, but is electrically insulated from the wiring pattern 3p.

As illustrated in FIG. 15, in the second layer L2, the through-hole via 3v, is electrically insulated from the ground pattern 3g. The land 3L of the respective wiring layers L1, L3, L4, and L6 are also electrically insulated from the ground pattern 3g.

In the fifth layer L5, the through-hole via $3v_s$ is electrically connected to the ground pattern 3q. That is, the ground pattern 3q of the fifth layer L5 is electrically connected to the land 3L of the respective wiring layers L1, L3, L4, and L6 via the through-hole via $3v_s$, but is not electrically connected to the wiring pattern 3p. The ground pattern 3q is not electrically connected to other patterns or the electric circuit inside the board 33. The through-hole via $3v_s$ is an example of a "conductive portion" according to the embodiment of the invention.

A shaft portion 39b of the screw 39 is inserted into the through-hole 3f from the front surface 3u side of the board 33, and the shaft portion 39b is screwed into the screw hole 31f of the frame 31, thereby fixing the board 33 to the frame 31 as illustrated in FIG. 15. The insulating heat radiation material 38 is disposed among the rear surface 3b of the board 33, the upper surface of the frame 31, and the shaft portion 39b of the screw 39. In this manner, a head portion 39a of the screw 39 come into contact with the land 3L and the through-hole via $3v_s$ on the front surface 3u of the board 33, and the ground pattern 3q for the electromagnetic wave noise resistance which is disposed in the fifth layer L5 is electrically connected to the frame 31 via the through-hole via $3v_s$, the screw 39, and the land 3L. The frame 31 is electrically connected to a body earth of a vehicle (not illustrated).

According to the above-described embodiment, in the load drive device 100 in which the controller 10 and the electric motor 20 are integrated with each other, the controller 10 is configured to include one six-layer printed board 33 having the electronic components mounted thereon for driving and controlling the electric motor 20, and the board 33 is accommodated in the internal space surrounded by the frame 31 and the cover 32. Accordingly, the drive circuit and the control circuit of the electric motor 20 do not need to be electrically connected to each other by using an external connection terminal such as a bus bar. The drive circuit and the control circuit may be electrically connected to each other by using the wiring pattern 3p disposed in the board 33. In this manner, the load drive device 100 can be miniaturized in the axial direction of the electric motor 20.

The wiring layers L1, L3, L4, and L6 having three or more layers are disposed inside the front surface 3u and the rear surface 3b of the board 33, and the wiring patterns 3p of the respective wiring layers L1, L3, L4, and L6 are electrically connected to each other by using the through-hole 3h and the via 3v. Therefore, the electric circuit can be more freely designed by increasing current capacity of the wiring pattern 3p for supplying the current to the electric motor 20. The respective wiring layers L1, L3, L4, and L6 are divided into the first region R1 having the drive circuit of the electric motor 20 and the second region R2 having the control circuit of the electric motor 20. The ground layer L2 disposed inside the board 33 is divided into the third region R3 overlapping with the first region R1 in the thickness direction of the board 33 and the fourth region R4 overlapping with the second region R2 in the thickness direction of the board 33. The ground pattern 3g (power system ground line 19) for the power system electrically connected to the drive circuit of the electric motor 20 is disposed in the third region R3, and the ground pattern 3g (control system ground line 18) for the control system electrically connected to the control circuit of the electric motor 20 is disposed in the fourth region R4. Therefore, the controller 10 can be prevented from malfunctioning due to signal noise generated in the drive circuit or the control circuit in the board 33.

The frame 31 for fixing the board 33 is also used as the heat sink. Accordingly, the heat generated from the electronic components mounted on the board 33 can be radiated outward by the frame 31. The case ground layer L5 having the ground pattern 3q for the electromagnetic wave noise resistance which is electrically connected to the frame 31 is formed inside the board 33. The ground pattern 3$q$ of the case ground layer L5 is electrically insulated from the ground pattern 3$g$ of the ground layer L2 and the wiring pattern 3$p$ of the wiring layers L1, L3, L4, and L6, and the frame 31 is connected to the body earth of the vehicle so as to be grounded. Therefore, the electromagnetic wave generated from the electric circuit formed in the board 33 can be restrained from adversely affecting other electronic devices mounted on the vehicle as the electromagnetic wave noise. In addition, the electromagnetic wave generated in other electronic devices can be restrained from adversely affecting the electric circuit formed in the board 33 as the electromagnetic wave noise.

Therefore, in the load drive device 100 integrated with the electric motor, it is possible to realize miniaturization, to prevent the malfunction of the controller 10, and to improve the heat radiating performance and the resistance to the electromagnetic wave noise.

In the above-described embodiment, the magnetic sensor 5 for detecting the rotation state of the rotor 22 of the electric motor 20 is mounted at the center of the circular portion 33$x$ on the rear surface 3$b$ of the board 33. In the board 33, the first region R1 having the drive circuit of the electric motor 20 and the third region R3 having the ground pattern 3$g$ for the power system electrically connected to the drive circuit are formed on one side which does not include the magnetic sensor 5 with respect to the mounting position (center position S5) of the magnetic sensor 5. In addition, the second region R2 having the control circuit of the electric motor 20 and the fourth region R4 having the ground pattern 3$g$ for the control system electrically connected to the control circuit are formed on the other side including the magnetic sensor 5 with respect to the mounting position (center position S5) of the magnetic sensor 5. In this manner, each space is secured while the drive circuit and the control circuit of the electric motor 20 are divided in the board 33. Therefore, each circuit can be easily formed.

In the above-described embodiment, the motor terminals 15 to 17 are electrically connected to the board 33 by arranging the motor terminals 15 to 17 in the portion overlapping with the electric motor 20 in the axial direction. Therefore, the load drive device 100 can also be miniaturized in the radial direction (direction perpendicular to the rotation axis J) of the electric motor 20. The connectors 7$p$ and 7$s$ are mounted on the rectangular portion 33$y$ which does not overlap with the electric motor 20 in the board 33 in the axial direction, and the fitting portions 7$a$ to 7$c$ of the connectors 7$p$ and 7$s$ are arranged toward the electric motor 20 side. Therefore, even in a state where the harnesses 51 and 61 for connecting the in-vehicle battery 50 or the external device are fitted to the fitting portions 7$a$ to 7$c$, the load drive device 100 can be miniaturized in the axial direction or the radial direction of the electric motor 20. Furthermore, the diameter of the circular portion 33$x$ where the connectors 7$p$ and 7$s$ of the board 33 are not mounted is substantially equal to the diameter of the electric motor 20. Accordingly, the load drive device 100 can be further miniaturized in the radial direction.

In the above-described embodiment, the first region R1 and the second region R2 do not merge in the respective wiring layers L1, L3, L4, and L6 of the board 33. Therefore, the drive circuit of the electric motor 20 formed in the first region R1 and the control circuit of the electric motor 20 formed in the second region R2 can be easily formed in a separated state. In this manner, the respective circuits can be prevented from adversely affecting each other due to the noise. The third region R3 and the fourth region R4 of the ground layer L2 of the board 33 merge only in the vicinity of the connectors 7$p$ and 7$s$ (connection point X in FIG. 10). Therefore, the ground pattern 3$g$ for the power system formed in the third region R3 and the ground pattern 3$g$ for the control system formed in the fourth region R4 can be easily formed in a separated state in the portions other than the connectors 7$p$ and 7$s$. In this manner, the respective circuits can be prevented from adversely affecting each other due to the noise.

On the other hand, as FETs Q1 to Q6 for switching the current flowing to the coils 25$u$, 25$v$, and 25$w$ of the electric motor 20 are located farther from the power connector 7$p$, the wire length of the current path from the in-vehicle battery 50 to FETs Q1 to Q6 is lengthened, and the waveform of the current is deformed, thereby causing a possibility that the driving of the electric motor 20 may be hindered. However, in the present embodiment, FETs Q1 to Q6 and the electrolytic capacitor 9 for the smoothing purpose are mounted on the circular portion 33$x$ on the front surface 3$u$ of the board 33, and the electrolytic capacitor 9 is electrically connected to FETs Q1 to Q6. Therefore, the electrolytic capacitor 9 can prevent the deformation of the waveform of the current supplied from the in-vehicle battery 50 to the respective FETs Q1 to Q6 via the connectors 7$p$ and 7$s$. As described above, even during the switching where the current is greatly and transiently changed, the current is sufficiently supplied from the electrolytic capacitor 9 to FET Q1 located farthest away from the power connector 7$p$ and connected to the current upstream side of the current supplied from the in-vehicle battery 50. As a result, the electric motor 20 can be stably driven by the inverter circuit 3 including FETs Q1 to Q6.

In the above-described embodiment, the heat-generating electronic components such as FETs Q1 to Q7 and the control unit 1 are mounted on the portion overlapping with the electric motor 20 in the axial direction on the front surface 3$u$ of the board 33, and the thermal via group 3$v_t$ for transferring the heat generated by the heat-generating electronic components to the rear surface of the board 33 is disposed in the board 33 immediately below the heat-generating electronic components. Therefore, the heat generated by the heat-generating electronic components mounted on the front surface 3$u$ of the board 33 is transferred to the rear surface 3$b$ side of the board 33 by the thermal via group 3$v_t$. In this manner, the heat is cooled by the air, or the heat is radiated by the frame 31 serving as the heat sink located on the rear surface 3$b$ side.

In the above-described embodiment, in particular, the protrusion 31$t$ is disposed at the position of the frame 31 overlapping with FETs Q1 to Q7, the thermal via group 3$v_t$, and the electric motor 20 which have particularly the greater calorific value in the axial direction, and the upper surface of the protrusion 31$t$ is formed parallel to the board 33. The insulating heat radiation material 38 is interposed between a portion on the rear surface 3$b$ of the board 33 overlapping with the electric motor 20 in the axial direction and the protrusion 31$t$ of the frame 31. Therefore, the heat generated by FETs Q1 to Q7 mounted on the front surface 3$u$ of the board 33 is efficiently transferred to the frame 31 via the thermal via group 3$v_t$ and the insulating heat radiation material 38 of the board 33. In this manner, the heat can be easily radiated outward from the frame 31.

Furthermore, in the above-described embodiment, the plurality of through-holes 3$f$ and the through-hole via 3$v_s$ for surrounding the respective through-holes 3$f$ are disposed in the board 33, and the plurality of the screw holes 31$f$ are disposed coaxially with the respective through-holes 3f in the frame 31. The screw 39 having the conductor is inserted into the respective through-holes 3f from the front surface 3u side of the board 33, and is screwed into the respective screw holes 31f. In this manner, the board 33 is fixed to the frame 31, and the head portion 39a of the screw 39 is brought into contact with the through-hole via $3v_s$. Therefore, while the board 33 is fixed to the frame 31 by using the screw 39, the ground pattern 3q for the electromagnetic wave noise resistance of the case ground layer L5 is electrically connected to the frame 31. In this manner, the resistance to the electromagnetic wave noise can be improved.

The invention can adopt various embodiments other than the above-described embodiment. For example, in the above-described embodiment, an example has been described in which the housing 21 and the frame 31 are separately formed. However, the invention is not limited only to this example. The housing having the electric motor incorporated therein and the frame may be integrally formed. A fin may be formed in the frame or the housing so as to be used as the heat sink.

In the above-described embodiment, an example has been described in which the electric motor 20 has the three-phase brushless motor. However, the invention is not limited only to this example. The invention is also applicable to the load drive device having the other electric motor.

In the above-described embodiment, the six-layer printed board 33 has been described as an example. However, the invention is not limited only to this example. For example, a multilayer board having five, seven, or more conductor layers may be used. Not only the board 33 having the circular portion 33x and the rectangular portion 33y but also the board having only the circular portion, only the rectangular portion, or other shapes may be used. That is, the board may be formed depending on a shape of the electric motor, a shape of the input/output connector, or a configuration of the electric circuit. The housing 21, the frame 31, and the cover 32 may also be formed in the similar manner.

In the above-described embodiment, an example has been described as follows. In order to detect the rotation state of the rotor 22 of the electric motor 20, the magnet 22g is disposed in the upper end portion of the shaft 22a of the rotor 22, and the magnetic sensor 5 is disposed on the rear surface of the board 33. However, the invention is not limited only to this example. The other detection target may be disposed in the rotor 22, and the other rotation sensor may be disposed in the board 33 so as to detect a physical change in the detection target which is caused by the rotation of the rotor 22.

In the above-described embodiment, an example has been described as follows. The thermal via group $3v_t$ is disposed immediately below the heat-generating electronic components such as FETs Q1 to Q7 in the board 33, and the heat generated from the heat-generating electronic components is transferred to the thermal via group $3v_t$ to the rear surface 3b side of the board 33. However, the invention is not limited only to this example. Alternatively, for example, as the heat transfer portion, a copper pin, a through-hole, a highly conductive resin may be disposed in the board immediately below the heat-generating electronic components. The heat transfer portion may be disposed so as to penetrate the board, or may be embedded so as not to penetrate the board.

In the above-described embodiment, an example has been described as follows. The ground pattern 3q for the electromagnetic wave noise resistance of the fifth layer L5 is electrically connected to the frame 31 by using the through-hole via $3v_s$ and the screw 39. However, the invention is not limited only to this example. Alternatively, for example, in the board 33, the conductor may be disposed on the peripheral surface of the through-hole 3f penetrating the screw 39 or in the upper and lower end portions so as to form the through-hole through which the screw 39 can penetrate. In this manner, the ground pattern 3q for the electromagnetic wave noise resistance of the fifth layer L5 may be electrically connected to the frame 31 via the through-hole and the screw 39. In addition, a conductive portion other than the above-described through-hole or the through-hole via $3v_s$ may be disposed in the board.

Furthermore, in the above-described embodiment, an example has been described in which the invention is applied to the load drive device 100 used in the electric power steering system. However, the invention is also applicable to the load drive device for other uses.

While the invention has been described with respect to a limited number of embodiments, those skilled in the art, having benefit of this disclosure, will appreciate that other embodiments can be devised which do not depart from the scope of the invention as disclosed herein. According, the scope of the invention should be limited only by the attached claims.

The invention claimed is:

1. A load drive device comprising:
an electric motor that drives a load;
a controller that comprises a board provided with electronic components mounted thereon and configured to drive and control the electric motor;
a housing in which the electric motor is incorporated;
a frame that is connected to the housing and serves as a heat sink; and
a cover that is attached to the frame so as to cover the board,
wherein the board is fixed to the frame so as to be electrically connected to a motor terminal configured to supply a current to the electric motor and perpendicular to an axial direction of a rotation axis of the electric motor,
wherein the board is one multilayer printed board comprising: wiring layers comprising wiring patterns and provided on a front surface and a rear surface of the multilayer printed board, respectively; at least one wiring layer comprising a wiring pattern and provided inside the multilayer printed board; and at least two ground layers comprising ground patterns, respectively, and provided inside the multilayer printed board, and the board comprises an interlayer connection wire that electrically connects the patterns of the different layers,
wherein the wiring pattern of each of the wiring layers configures a part of an electric circuit of the controller,
wherein the electronic components included in the electric circuit are mounted on the front surface and the rear surface of the board, respectively,
wherein the at least two ground layers comprise: a first ground layer comprising a first ground pattern for a circuit which is electrically connected to the wiring pattern of each of the wiring layers; and a second ground layer comprising a second ground pattern for electromagnetic wave noise resistance which is electrically connected to the frame,
wherein the electric circuit of the controller comprises: a drive circuit that drives the electric motor; and a control circuit that controls the electric motor,
wherein each of the wiring layers is divided into:
a first region in which the drive circuit is provided, and a second region in which the control circuit is provided, and wherein the first ground layer is divided into:
- a third region which overlaps with the first region in a thickness direction of the board, and in which the first ground pattern for a power system electrically connected to the drive circuit is provided, and
- a fourth region which overlaps with the second region in the thickness direction of the board, and in which the first ground pattern for a control system electrically connected to the control circuit is provided.

2. The load drive device according to claim 1,
wherein a rotation sensor configured to detect a rotation state of the electric motor is mounted on the rear surface of the board, and
wherein in the board, the first region and the third region are disposed on one side which does not include the rotation sensor with respect to a mounting position of the rotation sensor, and the second region and the fourth region are disposed on the other side which includes the rotation sensor with respect to the mounting position of the rotation sensor.

3. The load drive device according to claim 1,
wherein the motor terminal penetrates a portion of the frame overlapping with the electric motor in the axial direction, the motor terminal is electrically connected to a portion of the board overlapping with the electric motor in the axial direction, and the motor terminal is electrically insulated from the frame,
wherein the motor terminal comprises a connector mounted on a portion of the board which does not overlap with the electric motor in the axial direction,
wherein the connector comprises: a first fitting portion to which a first harness configured to supply the current from an external power source is fitted in an axial direction of the electric motor; and a second fitting portion to which a second harness configured to perform signal communication with an external device is fitted in the axial direction of the electric motor, and
wherein the first fitting portion and the second fitting portion are exposed to an electric motor side from the frame.

4. The load drive device according to claim 3,
wherein the third region and the fourth region of the first ground layer merge with each other in the vicinity of the connector.

5. The load drive device according to claim 3,
wherein a plurality of semiconductor switching elements configured to switch the current to be supplied to the electric motor are mounted on a portion of the first region overlapping with the electric motor in the axial direction, and
wherein an electrolytic capacitor electrically connected to the plurality of semiconductor switching elements is mounted in the vicinity of one of the semiconductor switching elements which is located at a position farthest away from the connector and which is connected to an upstream side of the current to be supplied from the external power source.

6. The load drive device according to claim 1,
wherein a heat-generating electronic component is mounted on a portion of the front surface of the board which overlaps with the electric motor in the axial direction,
wherein a heat transfer portion that transfers heat generated by the heat-generating electronic component to the rear surface of the board is disposed immediately below the heat-generating electronic component in the board, and
wherein an insulating heat radiation material is disposed between a portion of the rear surface of the board which overlaps with the electric motor in the axial direction and a portion of the frame.

7. The load drive device according to claim 1,
wherein the board has a plurality of through-holes and a conductive portion electrically connected to the second ground pattern of the second ground layer around the through-holes,
wherein the frame has a plurality of screw holes disposed coaxially with the through-holes, respectively,
wherein the load drive device further comprises a plurality of screws made of a conductor, and
wherein the screws are inserted into the respective through-holes from the front surface of the board and are screwed into the respective screw holes such that the board is fixed to the frame, and the screws come into contact with the conductive portion and electrically connect the second ground pattern and the frame.

* * * * *